(12) United States Patent
Ankamah-Kusi et al.

(10) Patent No.: US 12,489,070 B2
(45) Date of Patent: Dec. 2, 2025

(54) ELECTRONIC DEVICE AND MULTILEVEL PACKAGE SUBSTRATE WITH INTEGRATED FILTER

(71) Applicant: Texas Instruments Incorporated, Dallas, TX (US)

(72) Inventors: Sylvester Ankamah-Kusi, Dallas, TX (US); Yiqi Tang, Allen, TX (US); Siraj Akhtar, Richardson, TX (US); Rajen Murugan, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 608 days.

(21) Appl. No.: 17/954,178

(22) Filed: Sep. 27, 2022

(65) Prior Publication Data

US 2024/0105647 A1 Mar. 28, 2024

(51) Int. Cl.
*H01L 23/34* (2006.01)
*H01L 21/48* (2006.01)
*H01L 23/498* (2006.01)
*H01L 23/66* (2006.01)
*H03H 7/01* (2006.01)
*H01L 23/00* (2006.01)

(52) U.S. Cl.
CPC .......... *H01L 23/66* (2013.01); *H01L 21/4857* (2013.01); *H01L 21/486* (2013.01); *H01L 23/49822* (2013.01); *H01L 23/49838* (2013.01); *H03H 7/0115* (2013.01); *H03H 7/0138* (2013.01); *H01L 24/13* (2013.01); *H01L 24/16* (2013.01); *H01L 2223/6616* (2013.01); *H01L 2223/6644* (2013.01); *H01L 2223/6672* (2013.01); *H01L 2223/6688* (2013.01); *H01L 2224/13147* (2013.01); *H01L 2224/16225* (2013.01); *H01L 2924/142* (2013.01)

(58) Field of Classification Search
CPC ............... H01L 21/4857; H01L 21/486; H01L 23/49822; H01L 23/49838; H01L 2223/6616; H01L 2223/6644; H01L 2223/6672; H01L 2224/16225; H01L 2223/6655; H01L 23/50; H03H 7/0115; H03H 2001/0085; H03F 3/195; H03F 2200/165
USPC ........................................................ 257/728
See application file for complete search history.

(56) References Cited

U.S. PATENT DOCUMENTS

| | | | |
|---|---|---|---|
| 11,664,571 B2 * | 5/2023 | Tokuda | H01P 5/185 333/116 |
| 2004/0023562 A1 | 2/2004 | Barry et al. | |
| 2004/0072472 A1 | 4/2004 | Barry et al. | |
| 2012/0086112 A1 | 4/2012 | Amaro et al. | |

(Continued)

*Primary Examiner* — Theresa T Doan
(74) *Attorney, Agent, or Firm* — Ronald O. Neerings; Frank D. Cimino

(57) ABSTRACT

An electronic device includes a multilevel package substrate, a semiconductor die, and a package structure, the multilevel package substrate having a first level, a second level, and a filter circuit in the first and second levels. The filter circuit includes a filter input terminal, a first capacitor, a first inductor, a second capacitor, a second inductor, a filter output terminal, and a reference terminal. The semiconductor die is attached to the multilevel package substrate and has a conductive structure coupled to one of the terminals of the filter circuit, and the package structure encloses the semiconductor die and a portion of the multilevel package substrate.

14 Claims, 23 Drawing Sheets

(56) References Cited

U.S. PATENT DOCUMENTS

2020/0211760 A1    7/2020  Brassfield et al.
2020/0313555 A1   10/2020  Devries, Jr. et al.
2021/0384150 A1 * 12/2021  Sridharan ............... H01L 24/03

* cited by examiner

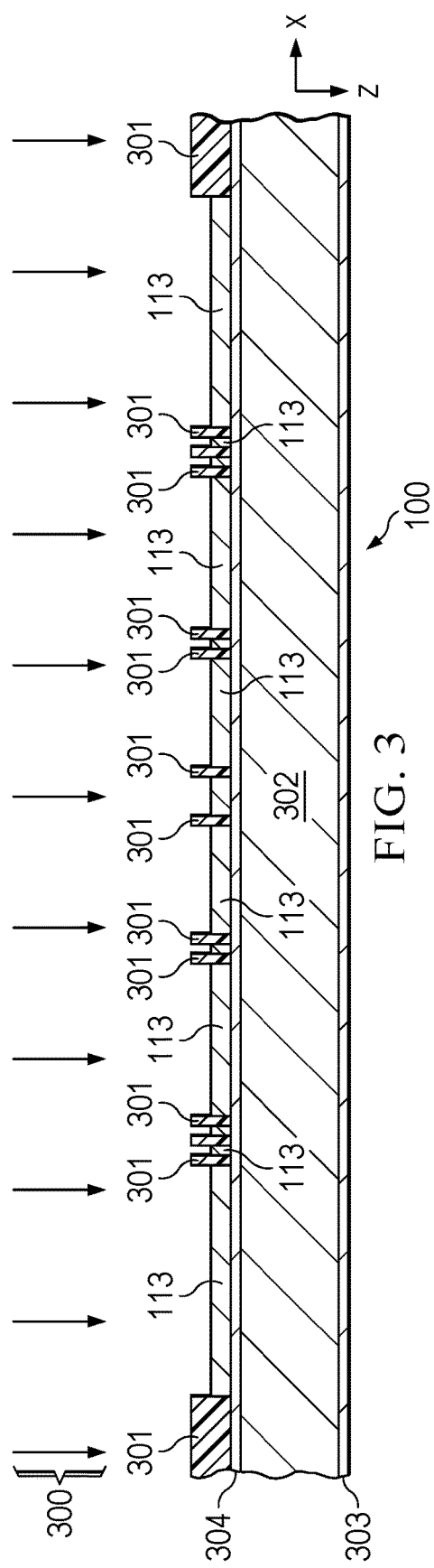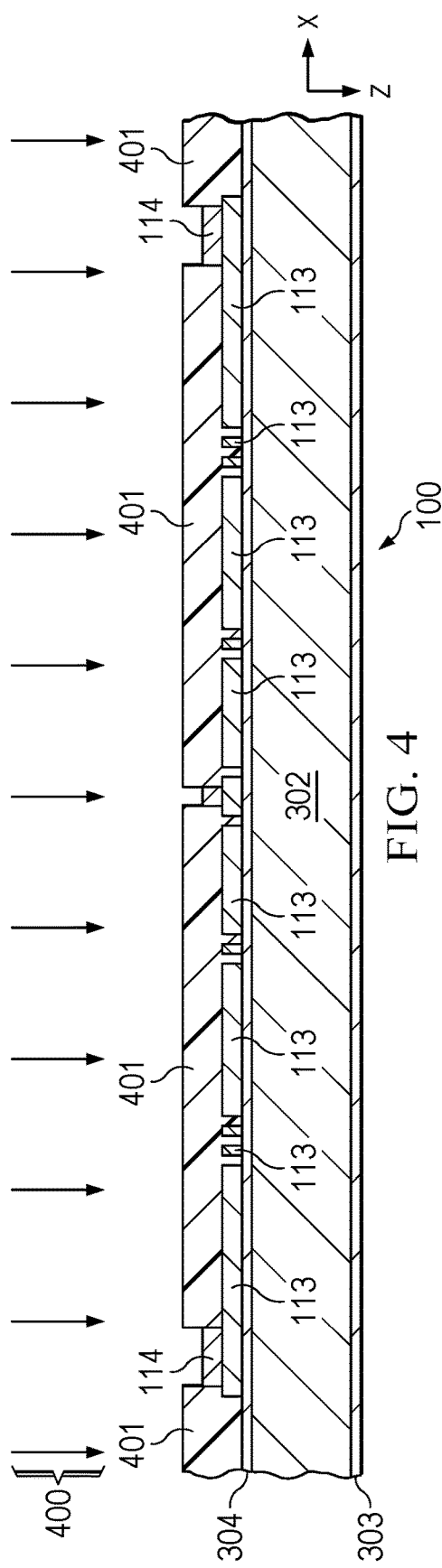

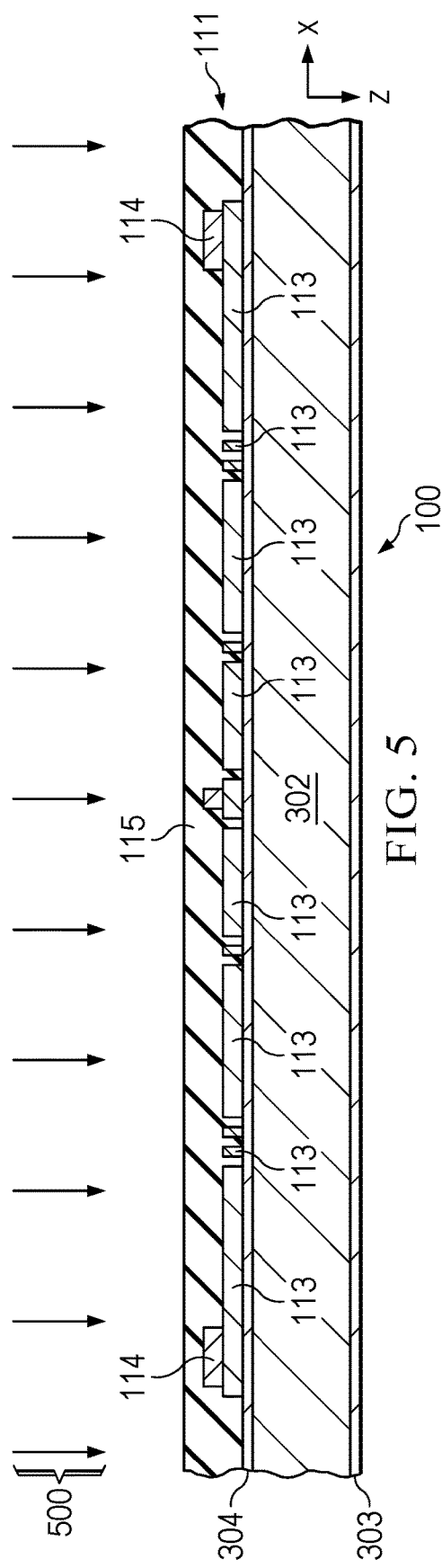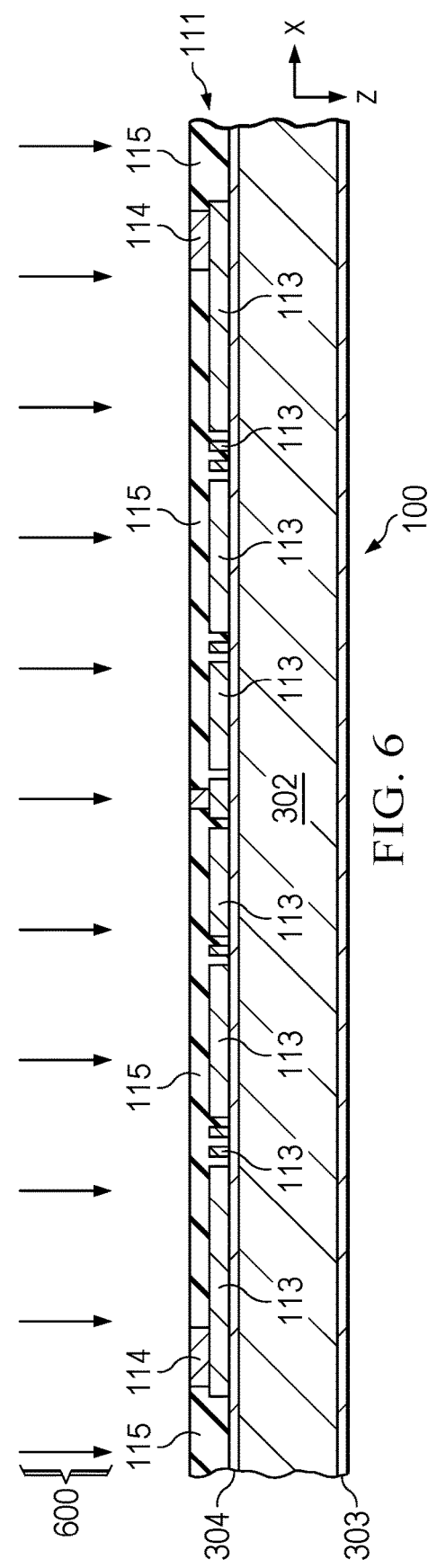

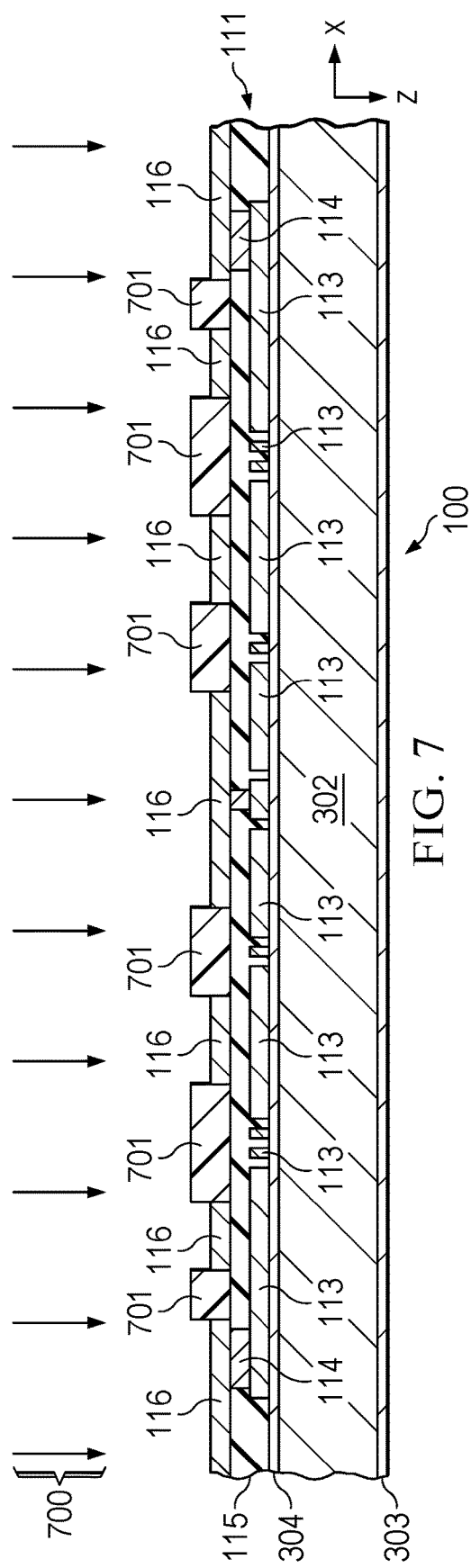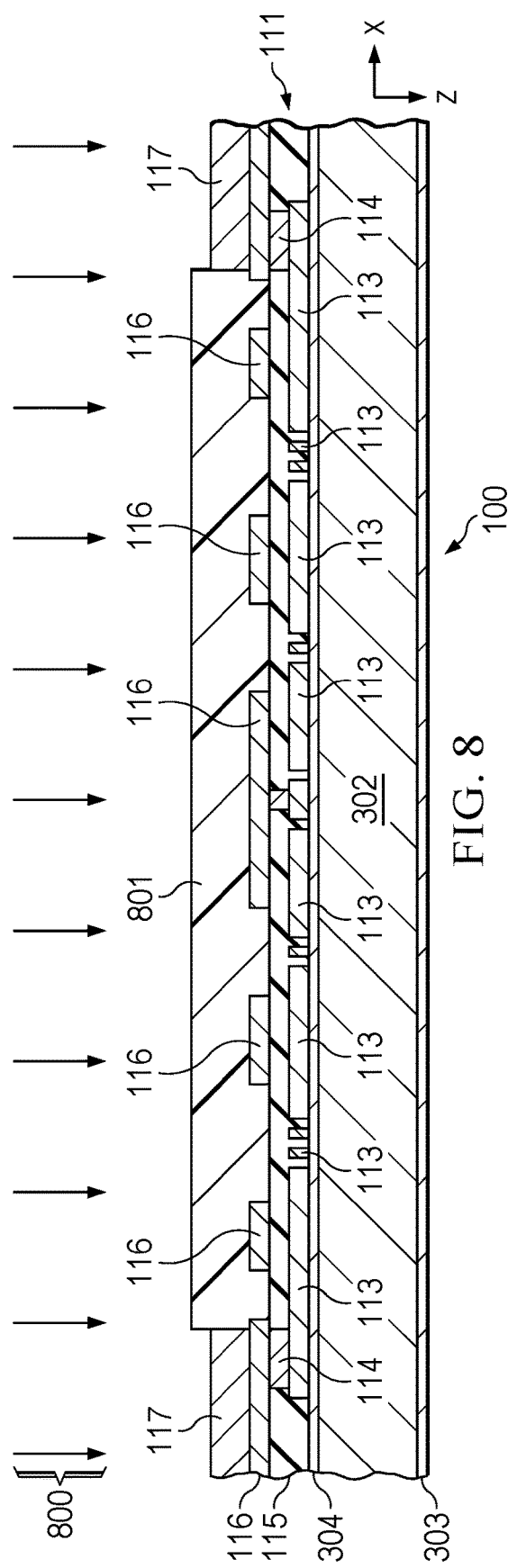

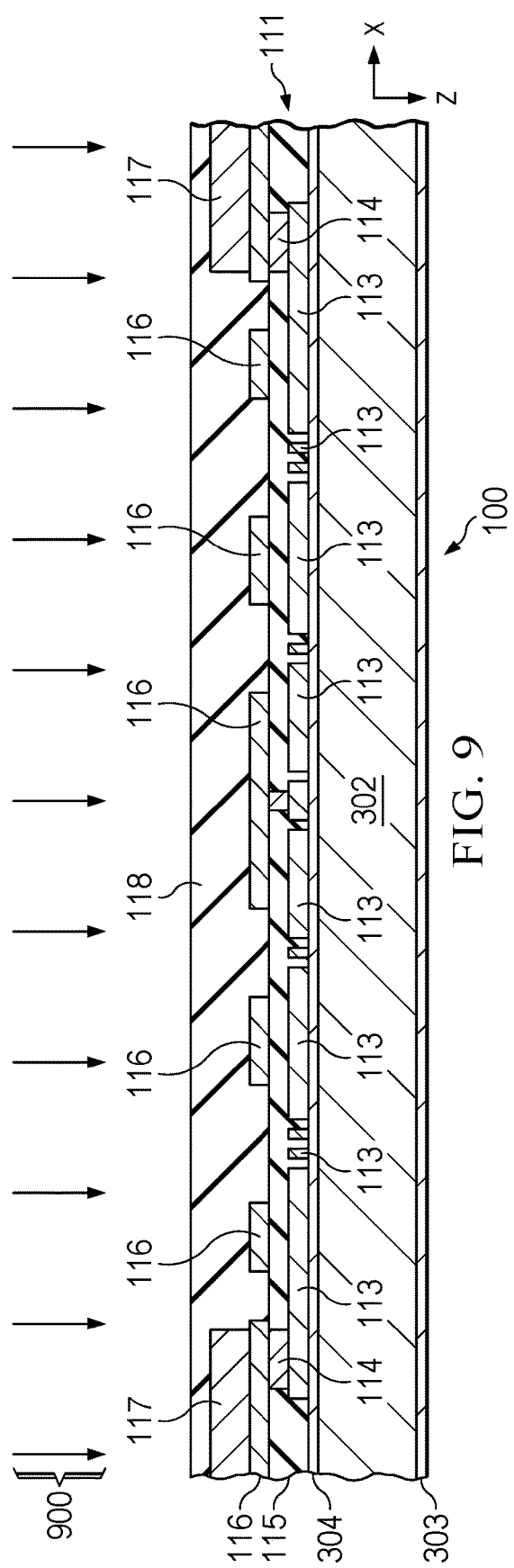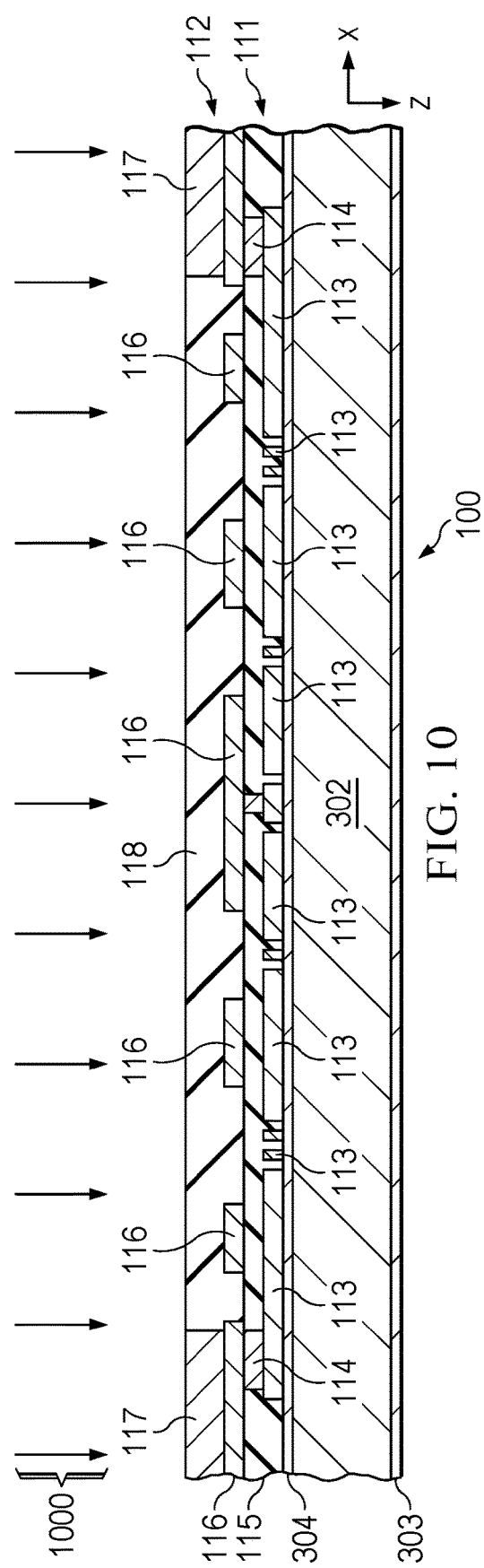
FIG. 9
FIG. 10

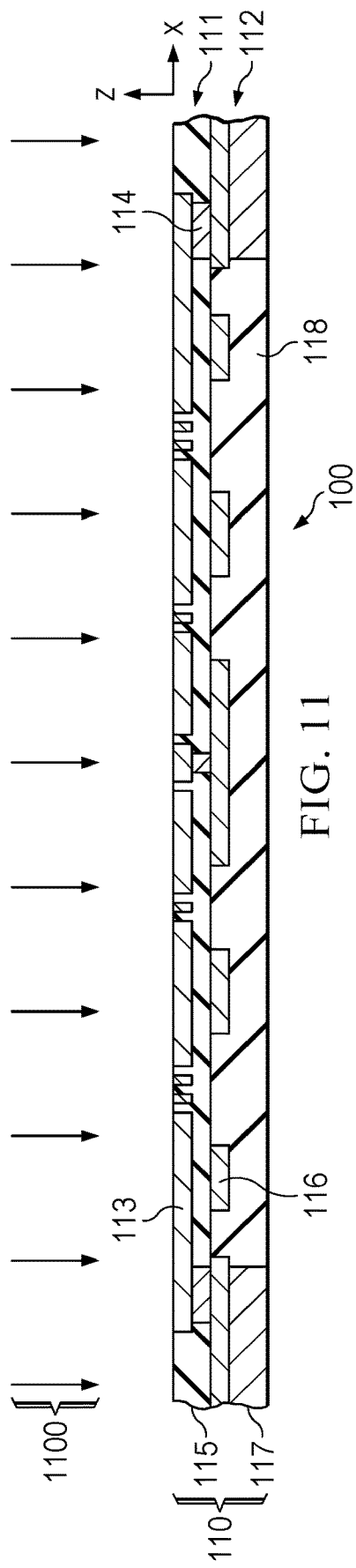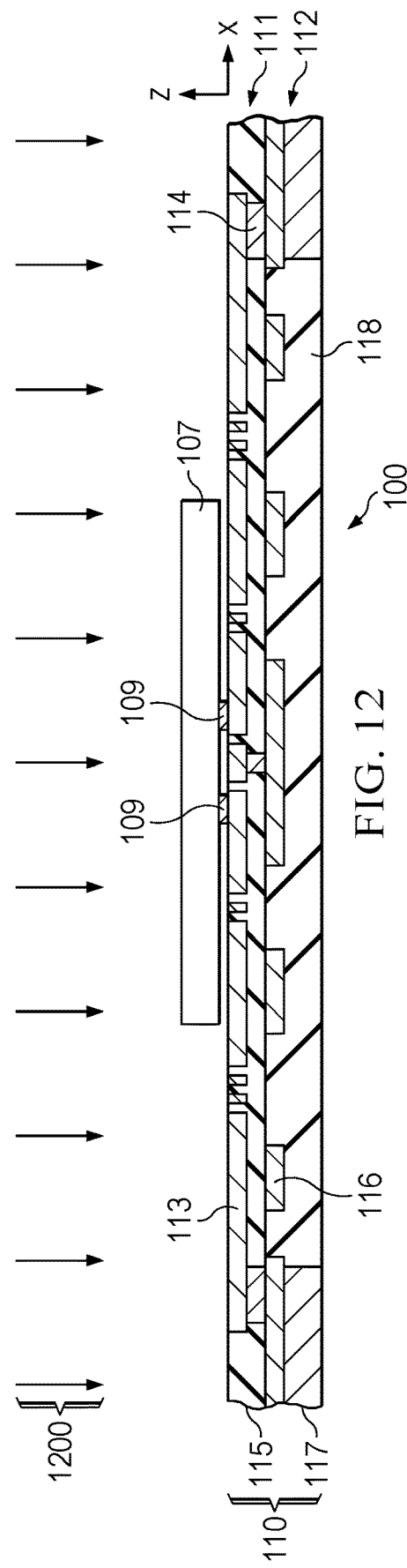

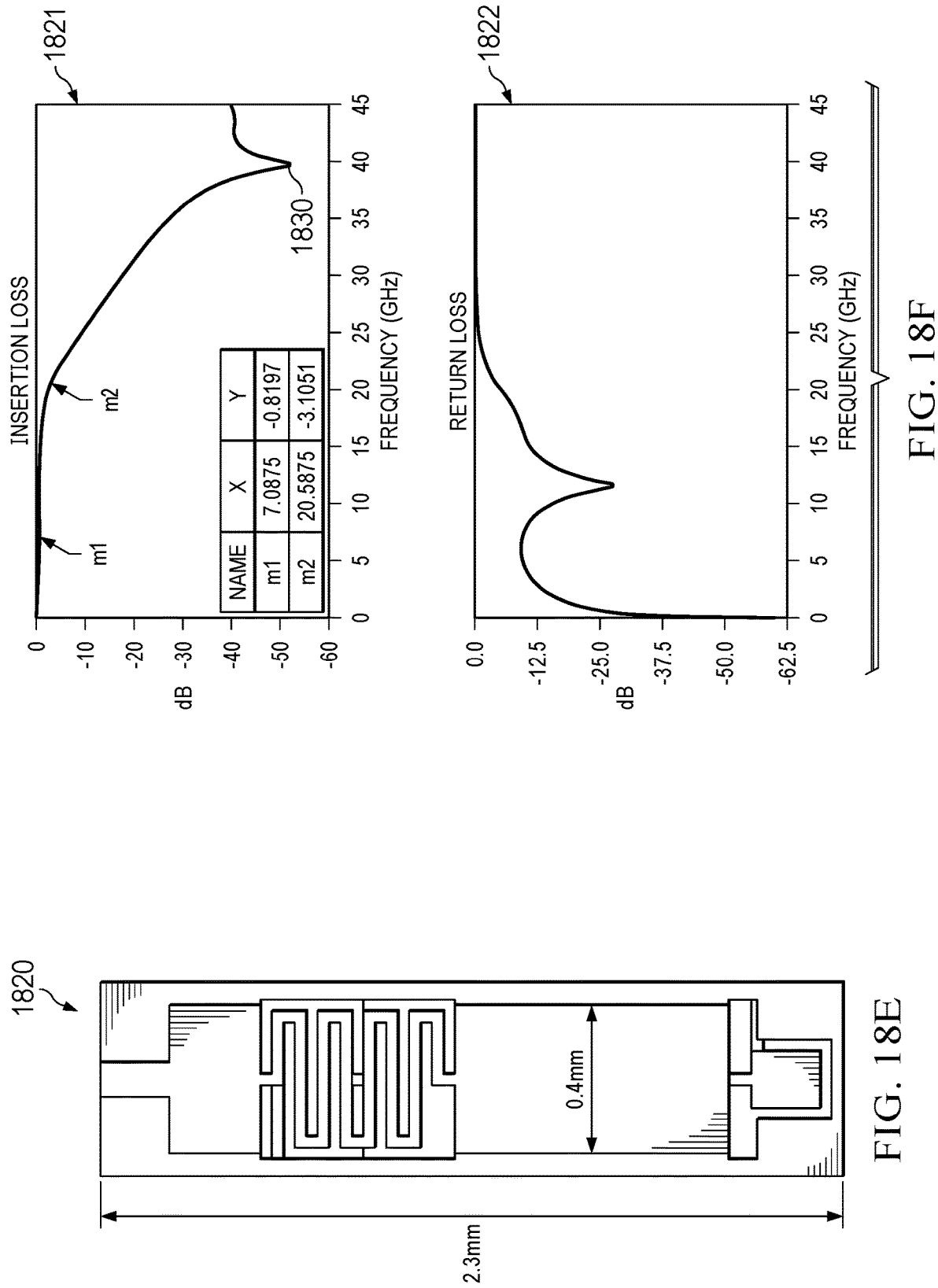

ELECTRONIC DEVICE AND MULTILEVEL PACKAGE SUBSTRATE WITH INTEGRATED FILTER

BACKGROUND

Many electronic circuits use filters for analog input and/or output signals. High speed electronic systems often use low pass filters (LPFs) in a variety of different circuit types, such as high speed or radio frequency (RF) amplifiers, high speed serializer/deserializers (serdes), etc. Providing filter circuits on-chip increases the area of the die, whereas off-chip filters increase the area of a host printed circuit board (PCB) and add cost to qualify and purchase passive components.

SUMMARY

In one aspect, an electronic device includes a multilevel package substrate, a semiconductor die, and a package structure. The multilevel package substrate has a first level, a second level, and a filter circuit that includes a filter input terminal, a first capacitor, a first inductor, a second capacitor, a second inductor, a filter output terminal, and a reference terminal. The semiconductor die is attached to the multilevel package substrate and has a conductive structure coupled to one of the terminals of the filter circuit, and the package structure encloses the semiconductor die and a portion of the multilevel package substrate.

In another aspect, a method of fabricating an electronic device includes forming a multilevel package substrate, attaching a semiconductor die to the multilevel package substrate, electrically coupling a conductive structure of the semiconductor die to a filter terminal of the multilevel package substrate, and forming a package structure that encloses the semiconductor die and a portion of the multilevel package substrate. The multilevel package substrate formation includes forming a first conductive metal trace that forms a set of contiguous metal structures including a filter input terminal, a first capacitor plate of a first capacitor, a serpentine first inductor winding of a first inductor, and a first capacitor plate of a second capacitor, as well as forming a dielectric layer over the first conductive metal trace, and forming a second conductive metal trace over the dielectric layer, the second conductive metal trace having a set of contiguous metal structures including a second capacitor plate of the first capacitor, a second capacitor plate of the second capacitor, and a reference terminal.

BRIEF DESCRIPTION OF THE DRAWINGS

FIGS. 3-11 are partial sectional side elevation views of a multilevel package substrate undergoing fabrication processing.

FIGS. 12-15 are partial sectional side elevation views of the electronic device of FIG. 1 undergoing fabrication processing using the multilevel package substrate of FIG. 11.

FIGS. 18E and 18F are partial top plan views and insertion and return loss simulated performance graphs for a three level multilevel package substrate with an integrated third order C-L low pass filter circuit with a cutoff frequency of 20 GHz.

DETAILED DESCRIPTION

Figure 1:
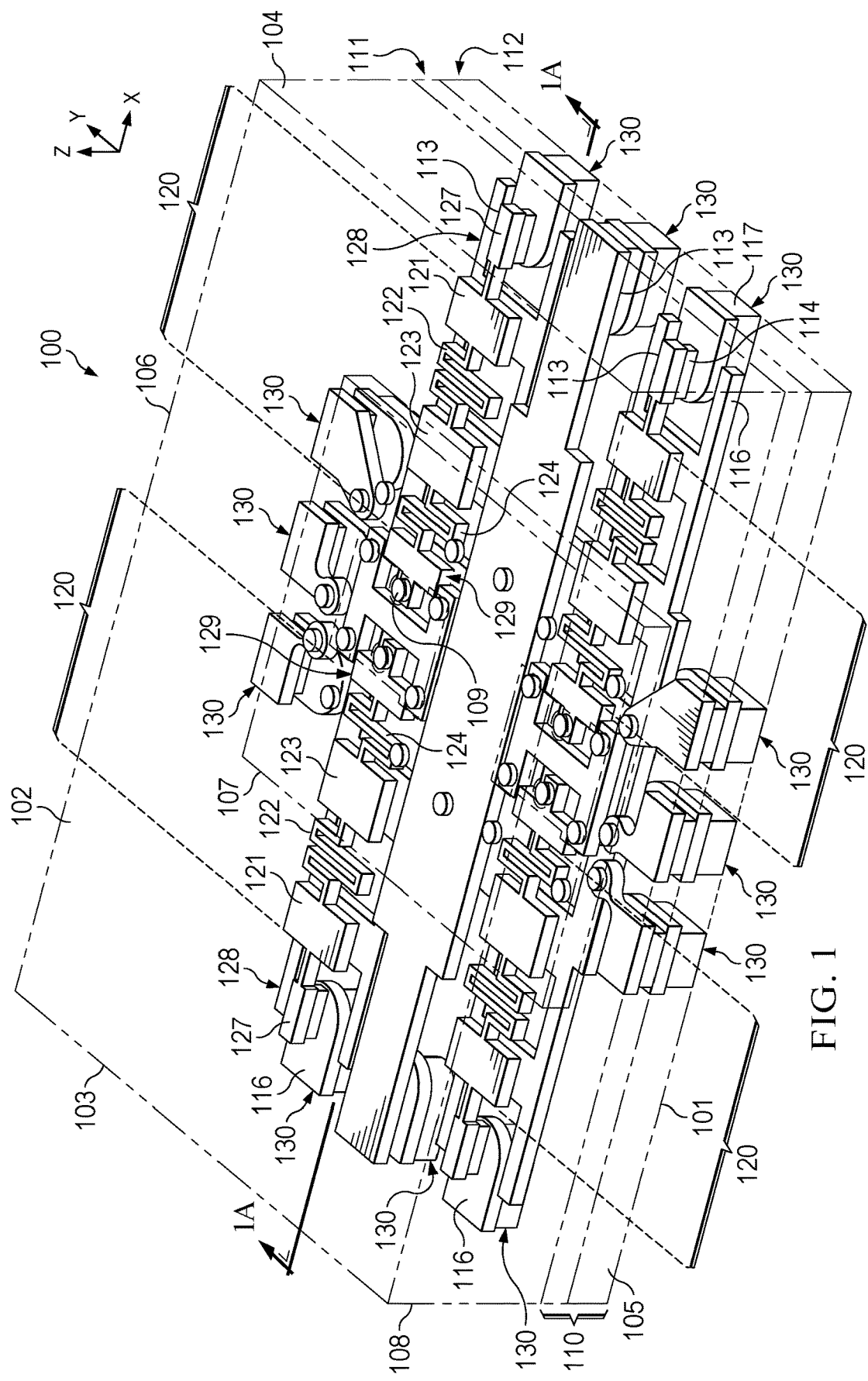
FIG. 1 is a top perspective view of an electronic device with a second order C-L filter circuit integrated into a two level multilevel package substrate.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. Unless otherwise stated, "about," "approximately," or "substantially" preceding a value means+/−10 percent of the stated value. One or more operational characteristics of various circuits, systems and/or components are hereinafter described in the context of functions which in some cases result from configuration and/or interconnection of various structures when circuitry is powered and operating.

Figure 1A:
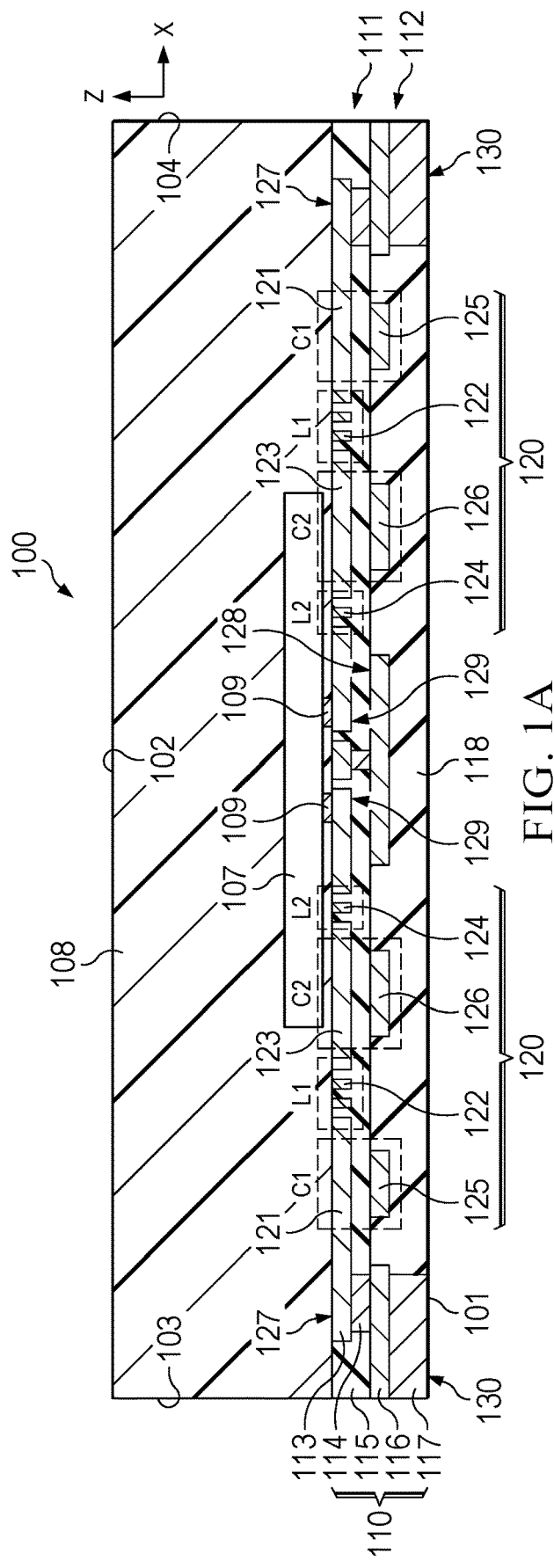
FIG. 1A is a partial sectional side elevation view of the electronic device taken along line 1A-1A of FIG. 1.
Figure 1B:
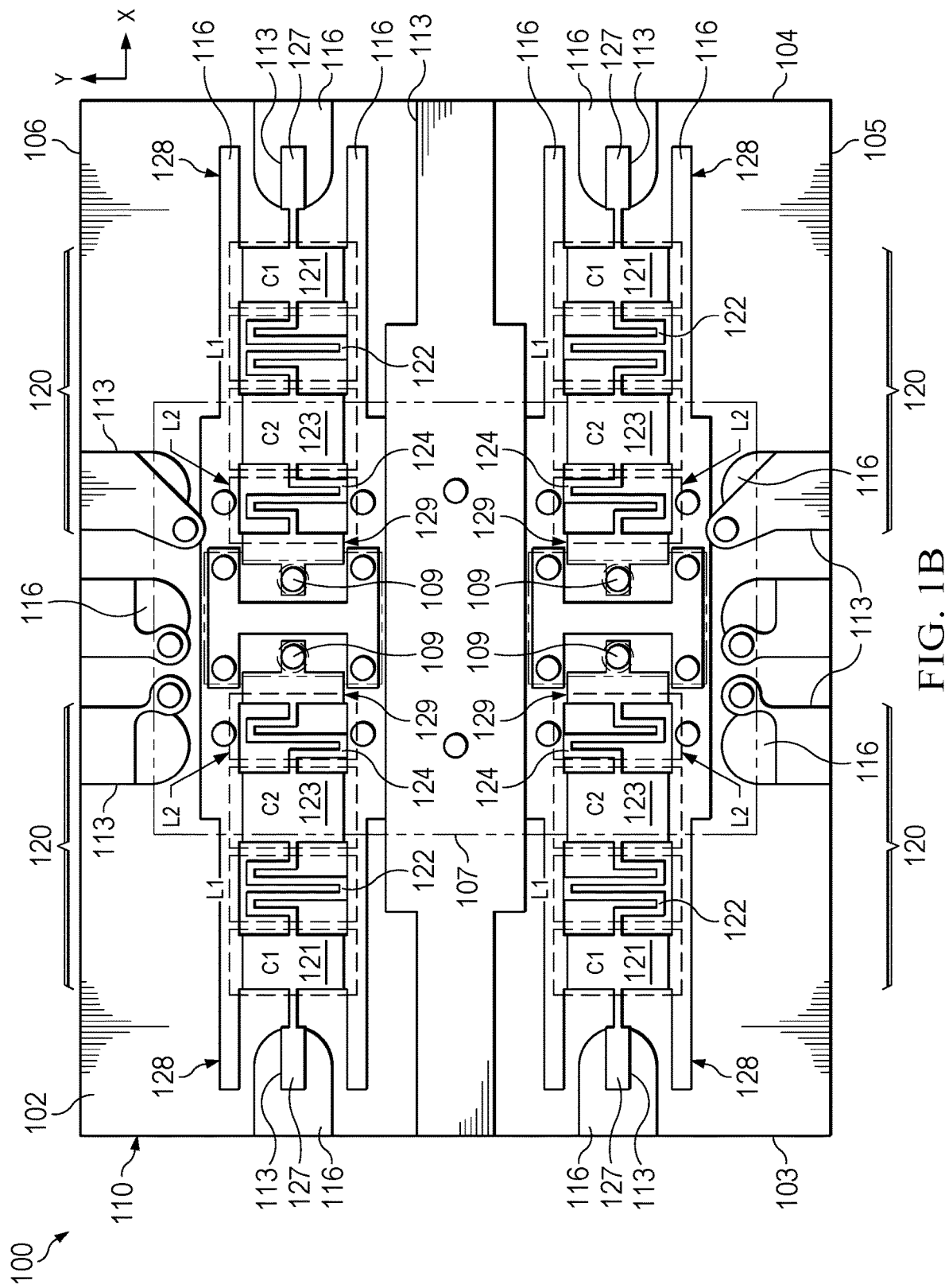
FIG. 1B is a top plan view of the electronic device of FIG. 1.
Figure 1C:
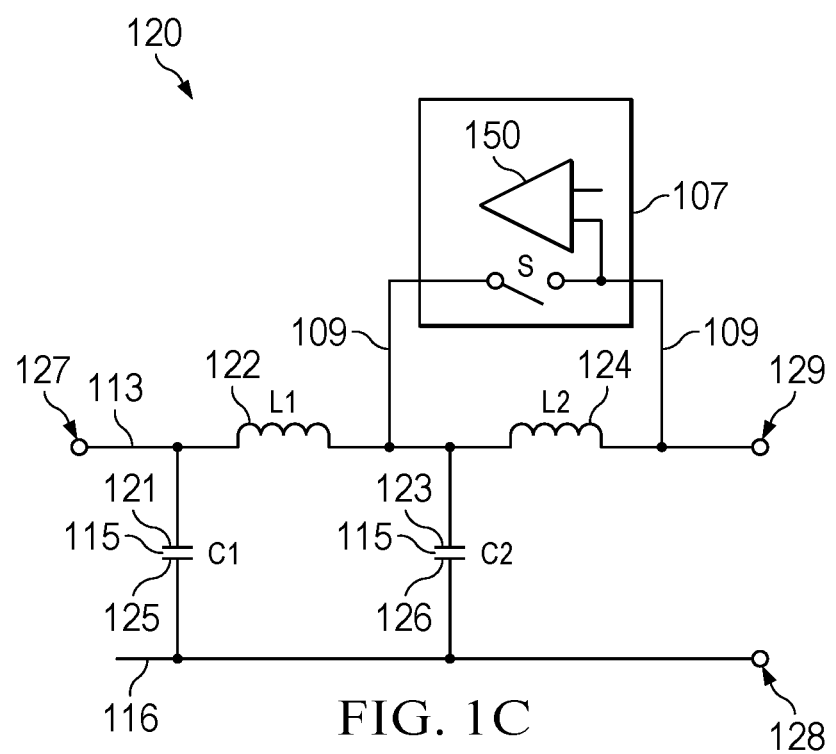
FIG. 1C is a schematic diagram of a multilevel package substrate filter circuit connected to an amplifier of a semiconductor die in the electronic device of FIG. 1.

FIGS. 1-1C show an electronic device 100 with capacitor-inductor (C-L) filter circuitry integrated into a multilevel package substrate. FIG. 1 shows a top perspective view of the electronic device 100, FIG. 1A shows a partial sectional side elevation view of the electronic device 100 taken along line 1A-1A of FIG. 1, FIG. 1B shows a top plan view of the electronic device 100, and FIG. 1C shows a schematic diagram of a multilevel package substrate filter circuit connected to an amplifier of a semiconductor die in the electronic device 100. The electronic device 100 is shown in an example position or orientation in a three-dimensional space with a first direction X, a perpendicular (orthogonal) second direction Y, and a third direction Z that is perpendicular (orthogonal) to the respective first and second directions X and Y, and structures or features along any two of these directions are orthogonal to one another.

The electronic device 100 includes a semiconductor die 107 enclosed by a package structure 108, such as a molded plastic, and the electronic device 100 has opposite first and second (e.g., bottom and top) sides 101 and 102, respectively, which are spaced apart from one another along the third direction Z. The package structure 108 and the electronic device 100 have laterally opposite third and fourth sides 103 and 104 spaced apart from one another along the first direction X, and opposite fifth and sixth sides 105 and 106 spaced apart from one another along the second direction Y in the illustrated orientation. The sides 101-106 in one example have substantially planar outer surfaces. In other examples, one or more of the sides 101-106 have curves, angled features, or other non-planar surface features.

The semiconductor die 107 has conductive features 109, such as aluminum or coper bond pads or pillars or solder balls that are mechanically attached to, and form electrical connections to, conductive metal features of a multilevel package substrate 110 having a first level 111 and a second level 112. The semiconductor die 107 includes one or more electronic components, such as a high speed amplifier circuit a high speed serializer/deserializer circuit, etc., and the circuitry of the semiconductor die 107 is electrically coupled to conductive metal features of the multilevel package substrate 110 to form an integrated circuit (IC) electronic device 100. The first level 111 includes patterned conductive metal trace features 113 (FIGS. 1-1C) and conductive metal via features 114 (FIGS. 1 and 1A), as well as a first dielectric layer 115 (FIGS. 1A and 1C) over and between the conductive metal trace features 113 and between the conductive metal via features 114. The second level 112 includes patterned conductive metal trace features 116 (FIGS. 1-1C) and conductive metal via features 117 (FIGS. 1 and 1A), as well as a second dielectric layer 118 (FIGS. 1A and 1C) over and between the conductive metal trace features 116 and between the conductive metal via features 117.

The multilevel package substrate 110 includes a filter circuit 120 including inductors and capacitors formed in the first and second levels. The illustrated example is a two level structure. In other examples (e.g., FIGS. 17-17B below) the multilevel package substrate includes more than two levels. In the illustrated example, moreover, the first and second levels 111 and 112 both include trace features and via features. In other implementations (e.g., FIGS. 17-17B), one or more of the levels does not include via features.

The electronic device 100 in FIGS. 1-1C includes four filter circuits 120 integrated in the multilevel package substrate 110. In other implementations, a single filter circuit or other number of filter circuits are integrated into a multilevel package substrate. In the illustrated implementation, the semiconductor die 107 includes two differential amplifier circuits, each having first and second inputs coupled to respective output terminals of respective ones of the filter circuits 120. In certain implementations, multiple filter circuits 120 of the multilevel package substrate 110 can have different filter characteristics (e.g., filter order, filter type, cutoff frequency, etc.). FIG. 1A a shows a sectional side view that illustrates an input low pass filter circuit 120 on the left, as well as another input low pass filter circuit 120 on the right, and FIG. 1C schematically illustrates the circuit connections of one example input low pass filter circuit 120 in the electronic device 100.

As best shown in FIGS. 1A-1C, each of the filter circuits 120 is a second-order low pass filter with a first capacitor C1 connected between a filter input terminal and a ground or reference terminal, a first inductor L1 connected between upper or first capacitor plates of the first capacitor C1 and a second capacitor C2, as well as a second inductor L2 coupled between the node joining the first inductor L1 and the second capacitor C2 and a filter output terminal. In this example, the first dielectric layer 115 extends between first and second (e.g., upper and lower) capacitor plates of the capacitors C1 and C2 to provide the associated capacitor dielectrics. In other examples (e.g., FIGS. 16-17B below), a single or multiple filter circuits can include higher order filters (e.g., third or higher order low pass filters), and/or different filter types can be used (e.g., band pass filters, high pass filters, etc.) of any first or higher order.

The integration of the filter circuits 120 in the multilevel package substrate 110 advantageously conserves die area for the high speed amplifier circuitry while using space in the multilevel package substrate 110 for the filter circuit components C1, C2, L1, and L2. The filter integration, moreover, conserves space on a host printed circuit board (not shown) by incorporating the components and interconnections of the filter circuit 120 in the electronic device 100. In addition, the integrated single or higher order C-L filter structures with vertical capacitors C1 and C2 provide space savings compared with integration of stepped impedance filters in a multilevel package substrate with minimal increase in package area. This facilitates cost effective filter integration to support high speed functionality in compact circuits and host circuit boards and systems.

The individual filter circuits 120 in the illustrated example include a filter input terminal 127, a ground or reference terminal 128, and a filter output terminal 129. In this example, the filter input terminals 127 are electrically coupled through conductive metal structures of the multilevel package substrate 110 to leads 130 of the electronic device 100 (FIGS. 1 and 1A). For the individual filter circuits 120, the first level 111 includes a patterned first conductive metal trace 113 that forms a set of contiguous metal structures that sequentially define the filter input terminal 127, a first capacitor plate 121 of the first capacitor C1, a serpentine first inductor winding 122 of the first inductor L1, a first capacitor plate 123 of the second capacitor C2, a serpentine second inductor winding 124 of the second inductor L2, and the filter output terminal 129. The first conductive metal trace 113 extends in a first plane of the first and second directions X and Y, and the capacitors C1 and C2 are vertical capacitors in the illustrated orientation along the third direction Z.

As best shown in FIGS. 1A and 1C, for the individual filter circuits 120, the second level 112 includes a patterned second conductive metal trace 116 that forms a set of contiguous metal structures that include a bottom or second capacitor plate 125 of the first capacitor C1, a second capacitor plate 126 of the second capacitor C2, and the reference terminal 128. The second conductive metal trace 116 extends in a second X-Y plane that is spaced apart along the third direction Z from the first plane of the first conductive metal trace 113. As shown in FIGS. 1 and 1B, the multilevel package substrate 110 includes metal trace and via features that electrically couple the filter output terminals 129 and the reference terminals 128 to conductive features 109 of the semiconductor die 107 example, to convey filtered analog signals to associated inputs of high speed amplifier circuits of the semiconductor die 107. In other implementations, the semiconductor die 107 includes one or more conductive structures 109 coupled to any one or more of the filter circuit terminals 127, 128, and/or 129. For example, the multilevel package substrate 110 can include an output filter with a filter input terminal coupled to an amplifier output of the semiconductor die 107 (not shown), and the filter output terminal can be coupled to one of the leads 130. The package structure 108 in this example encloses the semiconductor die 107 and a portion of the multilevel package substrate 110, and the bottoms and sides of the conductive leads 130 are exposed, for example, to allow soldering to a host printed circuit board (not shown).

In the illustrated example, the first dielectric layer 115 of the first level 111 extends between the first and second capacitor plates 121, 125 of the first capacitor C1 along the third direction Z, and the dielectric layer 115 extends between the first and second capacitor plates 123, 126 of the second capacitor C2 along the third direction Z. In addition, as shown in FIGS. 1 and 1B, the second conductive metal trace 116 of the second level 112 includes a first opening under the serpentine first inductor winding 122 of the first inductor L1, and a second opening under the serpentine second inductor winding 124 of the second inductor L2.

As schematically illustrated in FIG. 1C, moreover, certain examples include structural features to allow adjustment or tuning of the integrated filter circuit 120, for example, by selectively bypassing one of the filter stages. The semiconductor die 107 in this example has a first conductive structure 109 coupled to a first terminal of the second inductor L2 and a second conductive structure 109 coupled to a second terminal of the inductor L2. In one implementation, the semiconductor die 107 includes configurable or programmable switches to selectively couple an input of a high speed amplifier 150 to a selected one of the terminals of the second inductor L2, for example, to adjust a performance characteristic (e.g., low pass filter cutoff frequency) of the filter circuit 120. In the example of FIG. 1C, the input of the amplifier 150 is coupled to the second terminal of the second inductor L2, and the semiconductor die 107 has a switch S coupled between the first and second conductive structures 109 to selectively bypass the second inductor L2. In other implementations, a programmable or configurable circuit (not shown) of the semiconductor die 107 can bypass the first inductor L1.

Referring now to FIGS. 2-15, FIG. 2 shows a method 200 of fabricating an electronic device with a filter circuit integrated into a multilevel package substrate and FIGS. 3-15 illustrate fabrication of the example electronic device 100 of FIGS. 1-1C above. The method 200 includes forming a multilevel package substrate 110 at 201-203. In this example, FIGS. 3-11 show the multilevel package substrate 110 undergoing fabrication processing as a panel or array with multiple unit areas. The first level (e.g., level 111) is formed at 201 with a metal trace that forms one or more first (e.g., upper) capacitor plates and one or more serpentine inductor windings. The second level (e.g., level 112) is formed at 202 including one or more second (e.g., lower) capacitor plates and openings, and further levels can be optionally formed at 203 in FIG. 2, for example, with further first capacitor plates and/or serpentine inductor windings.

FIGS. 3-11 show one example, in which an electroplating steps are used to form patterned metal trace features and patterned metal via features, followed by compression molding of insulator material and planarization for each level of the multilevel package substrate 110 of FIGS. 1-1C described above. The multilevel package substrate 110 provided and/or manufactured at 201-203 in FIG. 2 includes the above-described features with multiple trace and via levels. In one implementation, the multilevel package substrate 110 is fabricated in a separate fabrication process and is provided as an input component (e.g., a panel or strip with rows and columns of unit areas) to a different manufacturing process for packaging along with the semiconductor die 107. In another implementation, a single fabrication process creates the multilevel package substrate 110 and includes further processing to manufacture packaged semiconductor devices such as the electronic device 100.

In the illustrated example, the multilevel package substrate fabrication at 201-203 includes forming the first level 111 with patterned conductive metal features 113 and 114 and a dielectric layer 115 on a carrier structure 302, and subsequently forming the second level 112 on the first level at 202, after which the carrier structure is removed from the first level. Following the fabrication of multiple rows and columns of the substrate panel array, the panel array is used as a component in the fabrication of a panel or array of the electronic devices 100. FIGS. 3-6 show formation of the first level 111 at 201 in one example, using an electroplating process 300 and a patterned plating mask 301. The illustrated example forms the patterned first conductive metal trace 113 that forms a set of contiguous metal structures including the filter input terminal 127, the first capacitor plate 121 of the first capacitor C1, the serpentine first inductor winding 122 of the first inductor L1, and the first capacitor plate 123 of the second capacitor C2, as well as forming the first via structures 114 and forming the dielectric layer 115 over the first conductive metal trace 113 and the vias 114.

The first level formation at 201 starts with forming the first trace layer 113 using a stainless-steel carrier 302, such as a panel or strip with multiple prospective multilevel package substrate sections or unit areas, one of which is shown in FIG. 3. The illustrated example includes conductive metal features formed by electroplating which are or include copper. In other implementations, a different conductive metal can be used, such as aluminum or metals that include aluminum, etc. The carrier structure 302 in one example includes thin copper seed layers 303 and 304 formed by a blanket deposition process (not shown) such as chemical vapor deposition (CVD) on the respective bottom and top sides of the carrier structure 302 to facilitate subsequent electroplating via the process 300. The electroplating process 300 deposits copper onto the upper copper seed layer 304 in the portions of the topside of the carrier structure that are exposed through the patterned plating mask 301 to form the first patterned conductive features that form the metal traces 113 in the first level.

FIG. 4 shows the multilevel first package substrate 110 after the process 300 is completed and the plating mask 301 has been removed during formation of first vias 114. A second electroplating process 400 is performed in FIG. 4 using a patterned second plating mask 401. The electroplating process 400 deposits further copper onto exposed portions of the first traces 113 to form the vias 114. After the electroplating process 400 is completed, the second plating mask 401 is removed.

FIGS. 5 and 6 show formation of the first compression molded dielectric layer features 115 in the first level of the multilevel package substrate 110. A compression molding process 500 is performed in FIG. 5 to form the molded dielectric layer features 115 on exposed portions of the metal features of the first traces 113 and the copper metal vias 114 of the first level. In other implementations, a different dielectric layer formation process can be used, such as a deposition process (not shown). The compression molding process 500 forms the molded dielectric layer features 115 in FIG. 5 to an initial thickness that covers the first traces 113 and the copper metal vias 114. A grinding process 600 is performed in FIG. 6, which grinds upper portions of the molded dielectric material 115 and exposes the upper portions of the first vias 114. In another example, a chemical etch is used. In a further example, a chemical mechanical polishing (CMP) process is used. As shown in FIG. 6, the first dielectric layer 115 encloses a portion of the first traces 113.

Figure 2:
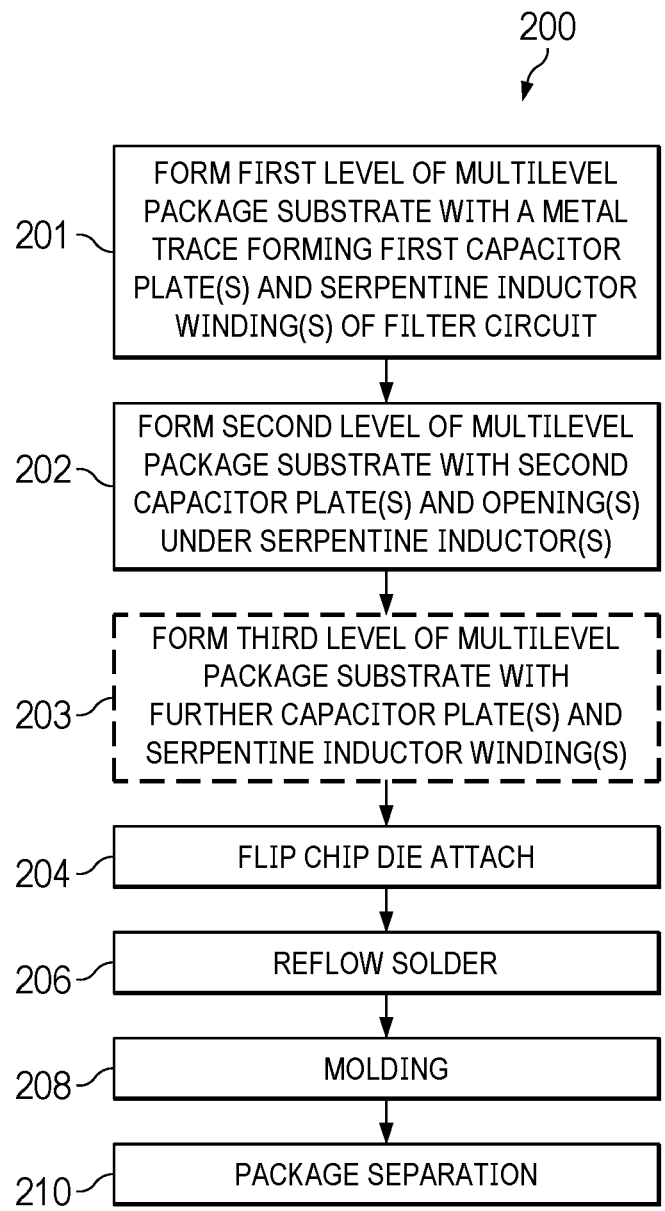
FIG. 2 is a flow diagram of a method of fabricating an electronic device with a filter circuit integrated into a multilevel package substrate.

FIGS. 7-10 show formation of the second level of the multilevel package substrate 110 at 202 in FIG. 2, including forming the second conductive metal trace 116 over the dielectric layer 115 with a set of contiguous metal structures including the second capacitor plate 125 of the first capacitor C1, the second capacitor plate 126 of the second capacitor C2, and the reference terminal 128, as well as second vias 117 and the second dielectric layer 118. In one example, the thermal processing used to form the second level is similar to that used to form the first level, although not a requirement of all possible implementations. In the illustrated example, the second level processing forms the second level 112 on the first level 111.

FIG. 7 shows the multilevel package substrate undergoing an electroplating process 700 with a patterned plating mask 701. The electroplating process 700 deposits copper onto the top side of the portions of the finished first level 111 that are exposed through the plating mask 701 to form the second trace 116 of the second level 112. After the process 700 is completed, the plating mask 701 is removed. FIG. 8 shows the multilevel package substrate undergoing another electroplating process 800 using another plating mask 801. The electroplating process 800 deposits further copper to form the second via structures 117 in the areas exposed by the plating mask 801. After the process 800 is completed, the plating mask 801 is removed.

FIGS. 9 and 10 show formation of the second dielectric layer 118 in the second level 112 using compression molding and grinding. A compression molding process 900 is performed in FIG. 9, which forms the second dielectric layer 118 on exposed portions of the conductive features of the second traces 116 and the second vias 117 of the second level to an initial thickness that covers the second traces 116 and the second vias 117. In other implementations, a different dielectric layer formation process can be used, such as a deposition process (not shown). A grinding process 1000 is performed in FIG. 10, which grinds upper portions of the second portions of the second dielectric layer 118 and exposes the upper portions of the second trace layer 116 and the second via layer 117. In another example, a chemical etch is used. In a further example, a chemical mechanical polishing process is used.

In the illustrated two level package substrate example, no third or further levels are formed and the optional processing at 203 is omitted. FIG. 11 shows the substrate panel undergoing a process 1100 that removes the carrier structure, and any remnant portions of the copper seed layers, leaving the panel array with the finished first and second levels 111 and 112, respectively.

Figure 13:
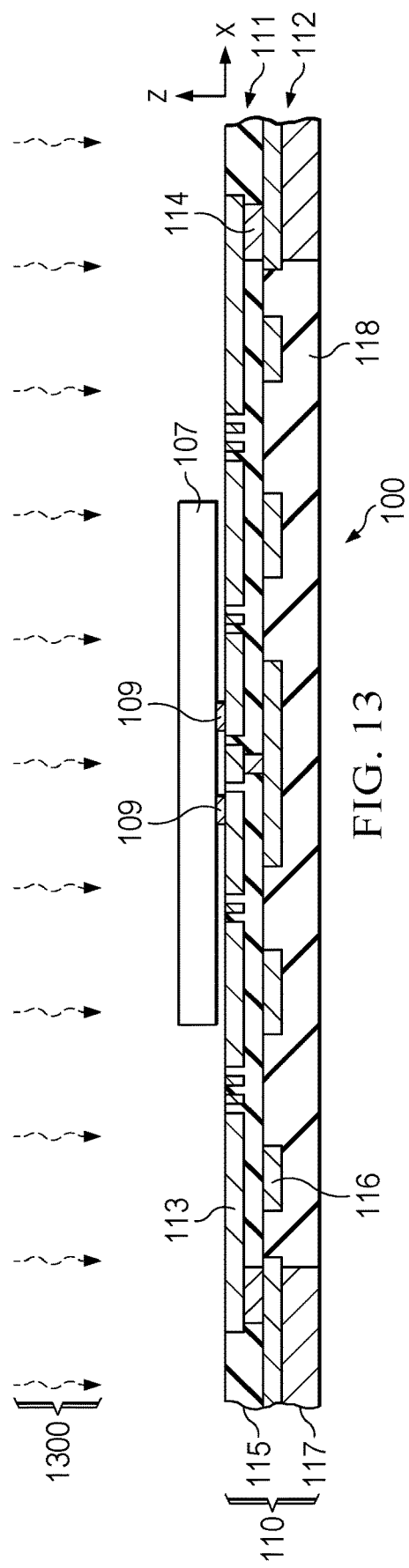

The method 200 continues at 204-210 in FIG. 2, and FIGS. 12-15 show the electronic device undergoing fabrication processing using the multilevel package substrate 110 of FIG. 11. At 204, the semiconductor die 107 is attached to the multilevel package substrate 110, and electrical connections are formed at 206. In the illustrated example, the semiconductor die 107 is flip chip soldered to respective traces of the first level 111 of the multilevel package substrate 110 at 204 and 206. In another implementation, die attach processing can be performed with suitable adhesives, and electrical connections can be made by bond wires (not shown). In these or other examples, further components (e.g., additional semiconductor dies, passive components, etc., not shown) can be attached and electrically connected at 204 and 206. FIG. 12 shows one example, in which a die attach process 1200 is performed that attaches the semiconductor die 107 to the multilevel package substrate 110, for example, using automated pick and place equipment (not shown). In one implementation, bottoms of the conductive features 109 (e.g., copper pillars) of the semiconductor die 107 are dipped in solder, and the semiconductor die 107 is positioned as shown in FIG. 12 with the copper pillars 109 and associated solder placed on respective portions of the first traces 113 of the multilevel package substrate 110. A thermal reflow process is performed at 206 of FIG. 2, an example of which is shown in FIG. 13, in which a thermal process 1300 is performed that heats and reflows the solder to form solder connections between the conductive copper pillars 109 of the semiconductor die 107 and the respective metal traces 113 of the first level 111 of the multilevel package substrate 110.

Figure 14:
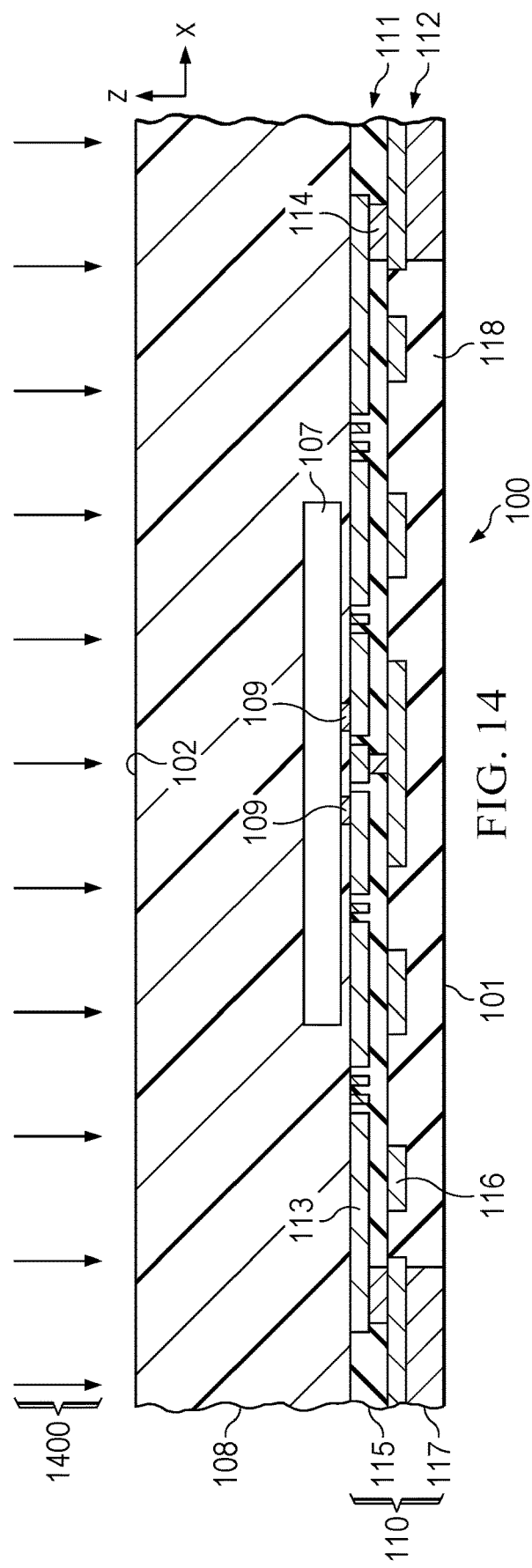
Figure 15:
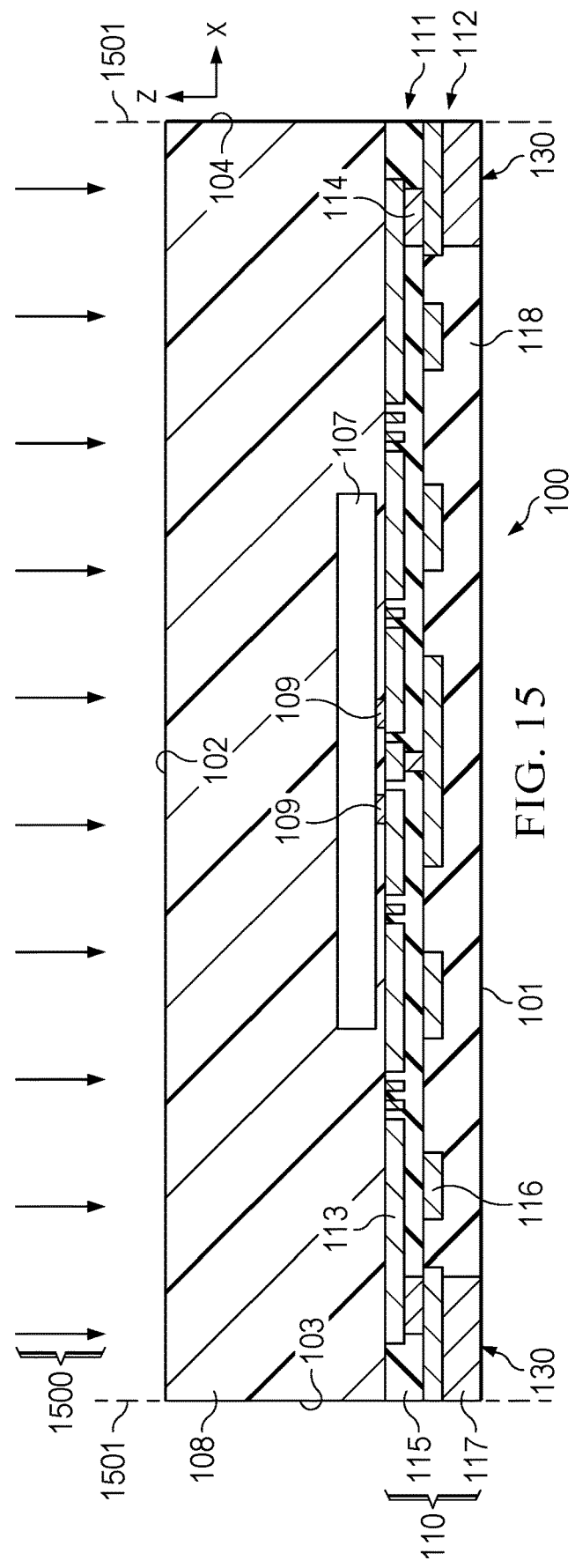

The method 200 continues at 208 with molding operations. FIG. 14 shows one example, in which a molding process 1400 is performed that forms a molded plastic package structure 108 that encloses the semiconductor die 107 and the exposed top side of the multilevel package substrate 110. The method 200 in one example also includes package separation at 210 in FIG. 2. FIG. 15 shows one example, in which a package separation process 1500 is performed that separates individual packaged electronic devices 100 from a panel array, for example, using saw or laser cutting. As shown in FIG. 15, the separation process 1500 in one example includes cutting along lines 1501 that are parallel to the second direction Y to form the device sides 103 and 104, and similar cutting operations are used along cut lines parallel to the first direction X to form the front and back sides 105 and 106 (not shown in FIG. 15). The resulting packaged electronic device 100 is shown in FIGS. 1-1C as discussed above.

Figure 16:
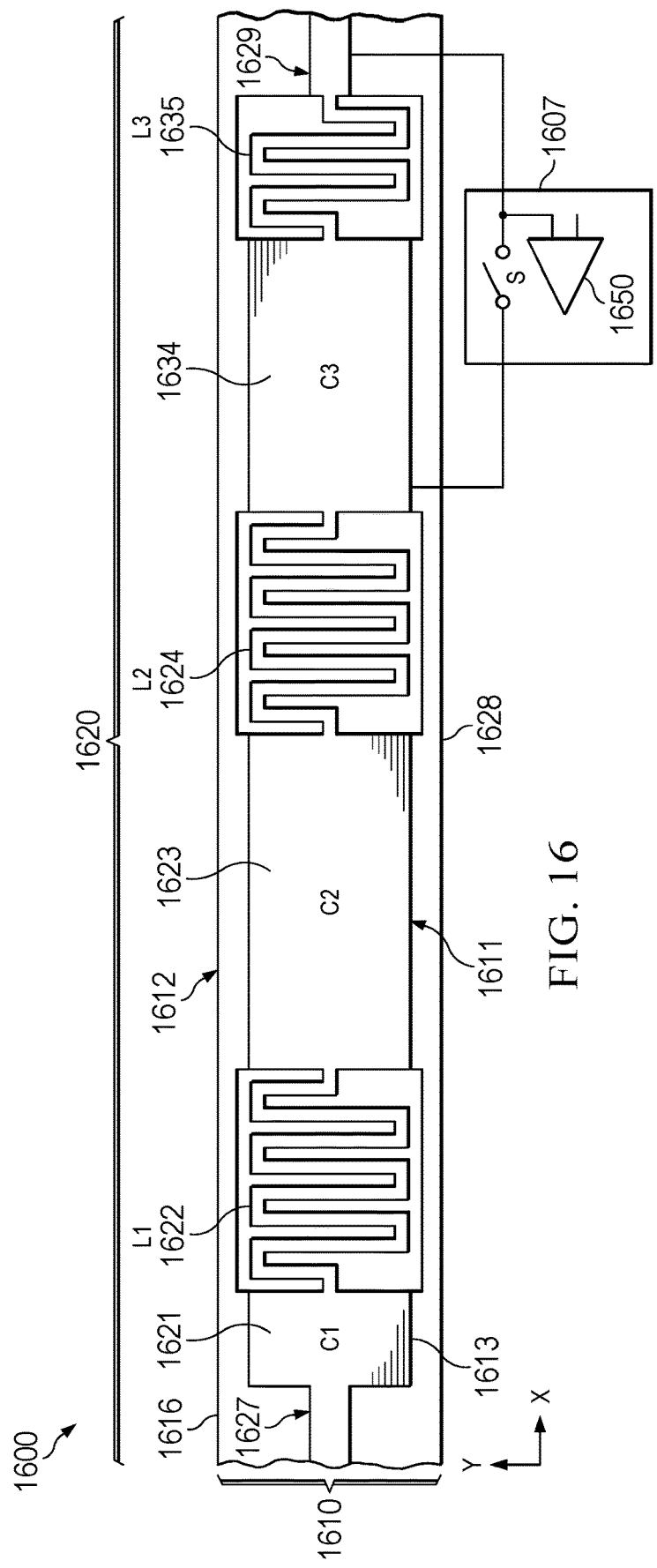
FIG. 16 is a partial top plan view of another electronic device including a two level multilevel package substrate with an integrated third order C-L filter circuit.
Figure 16A:
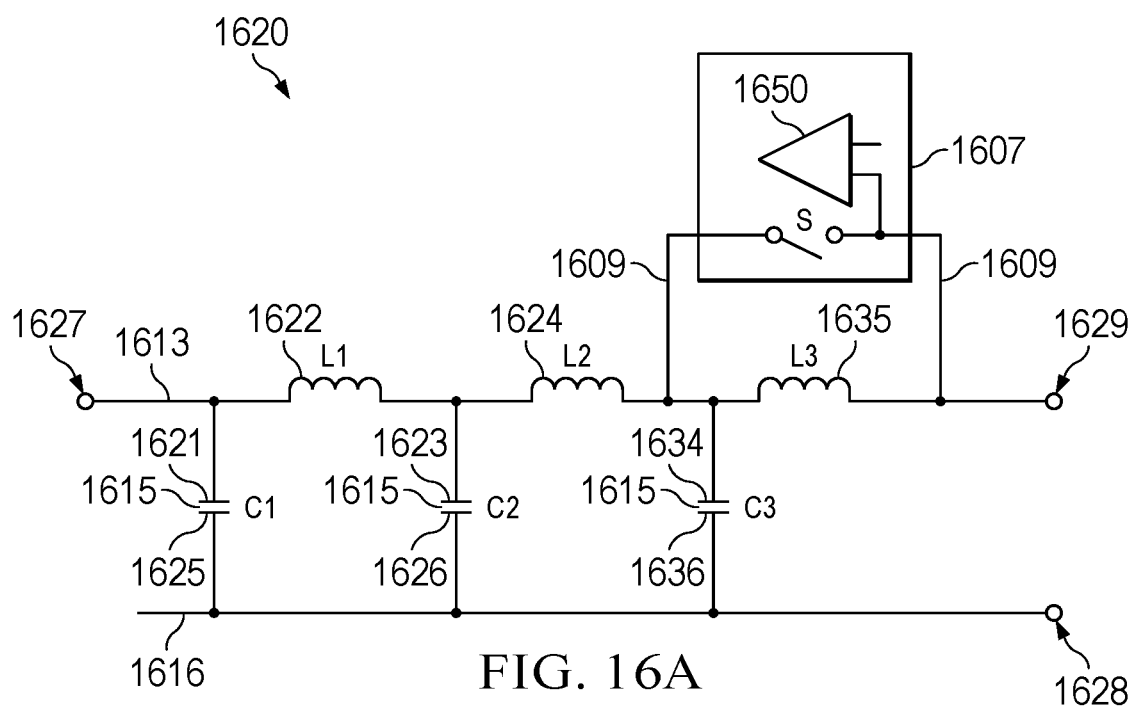
FIG. 16A is a schematic diagram of the multilevel package substrate filter circuit of FIG. 16 connected to an amplifier of a semiconductor die.

FIGS. 16 and 16A show another example electronic device 1600 with a two level package substrate 1610 with an integrated third order C-L filter circuit 1320 having components C1, L1, C2, and L2 as well as a third capacitor C3 and a third inductor L3. FIG. 16 shows a top view of a filter portion of the electronic device 1600 and FIG. 16A shows a schematic diagram of a multilevel package substrate filter circuit 1620 connected to an amplifier of a semiconductor die 1607 in the electronic device 1600. The electronic device 1600 in one implementation includes a package structure (not shown) that at least partially encloses the semiconductor die 1607. The semiconductor die 1607 has conductive features 1609 (FIG. 16A), such as aluminum or coper bond pads or pillars or solder balls that are mechanically attached to, and form electrical connections to, conductive metal features of the multilevel package substrate 1610.

The multilevel package substrate 1610 has a first level 1611 with patterned conductive first metal trace features 1613 and a second level 1612 with patterned conductive second metal trace features 1616. The semiconductor die 1607 includes one or more electronic components and the circuitry of the semiconductor die 1607 is electrically coupled to conductive metal features of the multilevel package substrate 1610 to form an integrated circuit electronic device 1600. The first level 1611 includes patterned conductive metal trace features 1613 and conductive metal via features (not shown), as well as a first dielectric layer 1615 (FIG. 16A) over and between the conductive metal trace features 1613 and between the conductive metal via features of the first level 1611, and which form the capacitor dielectric of the capacitors C1-C3. The second level 1612 includes patterned conductive metal trace features 1616 and conductive metal via features (not shown), as well as a second dielectric layer (not shown) over and between the conductive metal trace features 1616 and between the conductive metal via features of the second level.

The integrated filter circuit 1620 includes inductors L1-L3 and capacitors C1-C3 formed in the respective first and second levels 1611 and 1612. The illustrated example is a two level structure. In other examples the multilevel package substrate can include more than two levels. In the illustrated example, moreover, the first and second levels 1611 and 1612 both include trace features and via features. In other implementations, one or more of the levels does not include via features. As best shown in FIG. 1A, the filter circuit 1620 is a third-order low pass filter with a first capacitor C1 connected between a filter input terminal 1627 and a ground or reference terminal 1628, a first inductor L1 connected between upper or first capacitor plates of the first capacitor C1 and a second capacitor C2, as well as a second inductor L2 coupled between the node joining the first inductor L1 and the second capacitor C2. A third capacitor C3 is coupled between the second terminal of the second inductor L2 and the reference terminal 1628, and the third inductor L3 is coupled between the upper capacitor plate of the third capacitor C3 and a filter output terminal 1629. In this example, the first dielectric layer 1615 (FIG. 1A) extends between first and second (e.g., upper and lower) capacitor plates of the capacitors C1-C3 to provide the associated capacitor dielectrics. In other examples, a single or multiple filter circuits can include different filter types (e.g., band pass filters, high pass filters, etc.). In this example, the filter input terminal 1627 is electrically coupled through conductive metal structures of the multilevel package substrate 1610 to a lead (not shown) of the electronic device 1600.

The first level 1611 in this example includes a patterned first conductive metal trace 1613 that forms a set of contiguous metal structures that sequentially define the filter input terminal 1627, a first capacitor plate 1621 of the first capacitor C1, a serpentine first inductor winding 1622 of the first inductor L1, a first capacitor plate 1623 of the second capacitor C2, a serpentine second inductor winding 1624 of the second inductor L2, a first capacitor plate 1634 of the third capacitor C3, a serpentine third inductor winding 1635 of the third inductor L3, and the filter output terminal 1629. The first conductive metal trace 1613 extends in a first X-Y plane in the illustrated orientation. The second level 1612 includes a second conductive metal trace 1616 that forms a set of contiguous metal structures including a second capacitor plate 1625 of the first capacitor C1, a second capacitor plate 1626 of the second and third capacitors C2, C3, and the reference terminal 1628. The second conductive metal trace 1616 extends in a second X-Y plane that is parallel to and spaced apart from the first plane of the first conductive metal trace 1613. In one implementation, the semiconductor die 1607 includes configurable or programmable switches to selectively couple an input of a high speed amplifier 1650 to a selected one of the terminals of one of the inductors, such as the third inductor L3, to adjust a performance characteristic (e.g., low pass filter cutoff frequency) of the filter circuit 1620. In the example of FIG. 16A, the input of the amplifier 1650 is coupled to the second terminal of the third inductor L3, and the semiconductor die 1607 has a switch S coupled between the first and second conductive structures 1609 to selectively bypass the third inductor L3. In other implementations, a programmable or configurable circuit (not shown) of the semiconductor die 1607 can bypass a different one of the inductors L1-L3.

Figure 17:
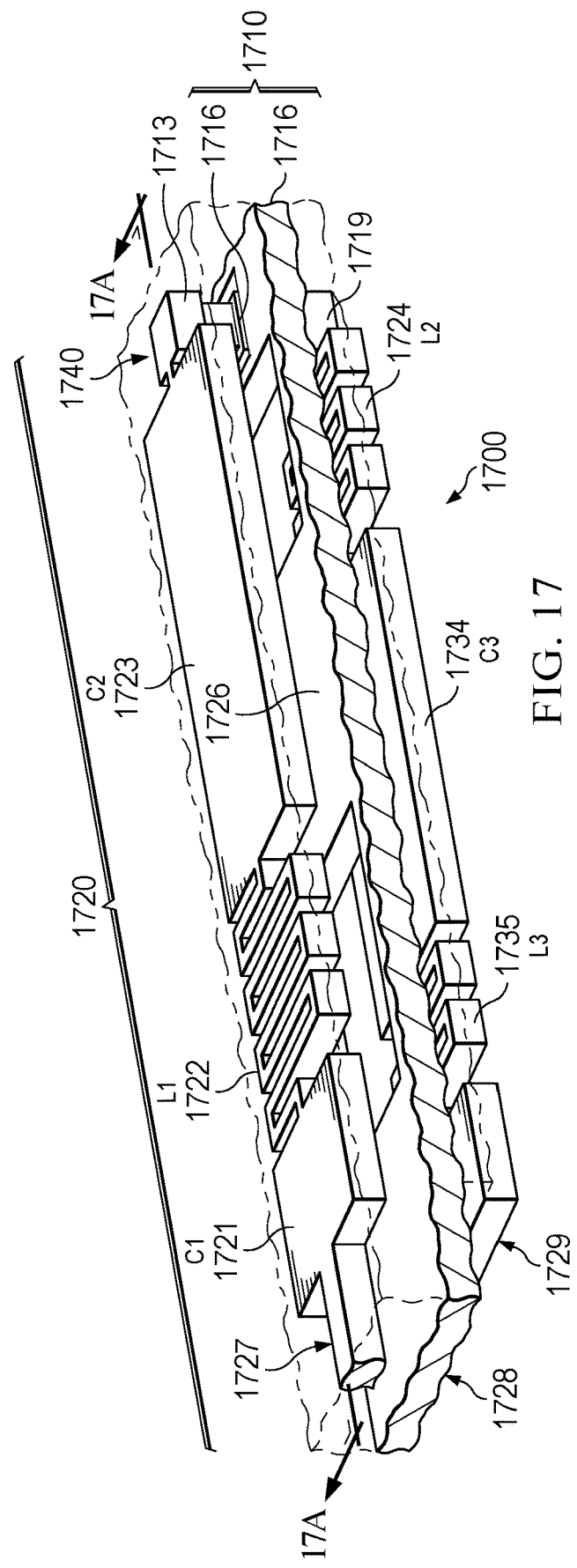
FIG. 17 is a partial top perspective view of another electronic device including a three level multilevel package substrate with an integrated third order C-L filter circuit.
Figure 17A:
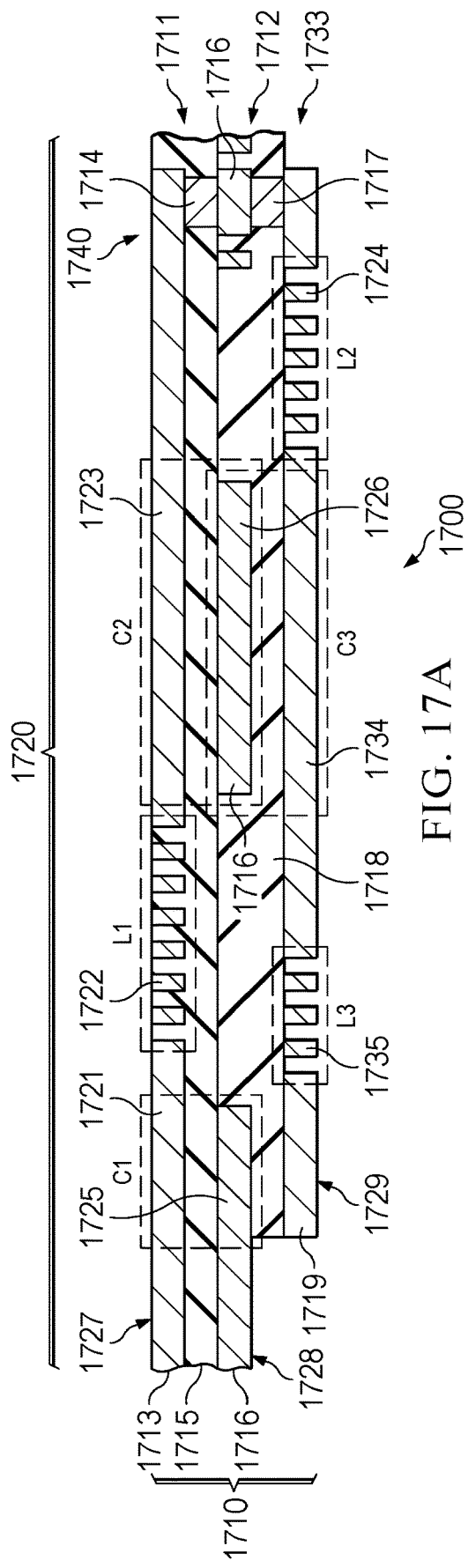
FIG. 17A is a partial sectional side elevation view of the electronic device taken along line 17A-17A of FIG. 17.
Figure 17B:
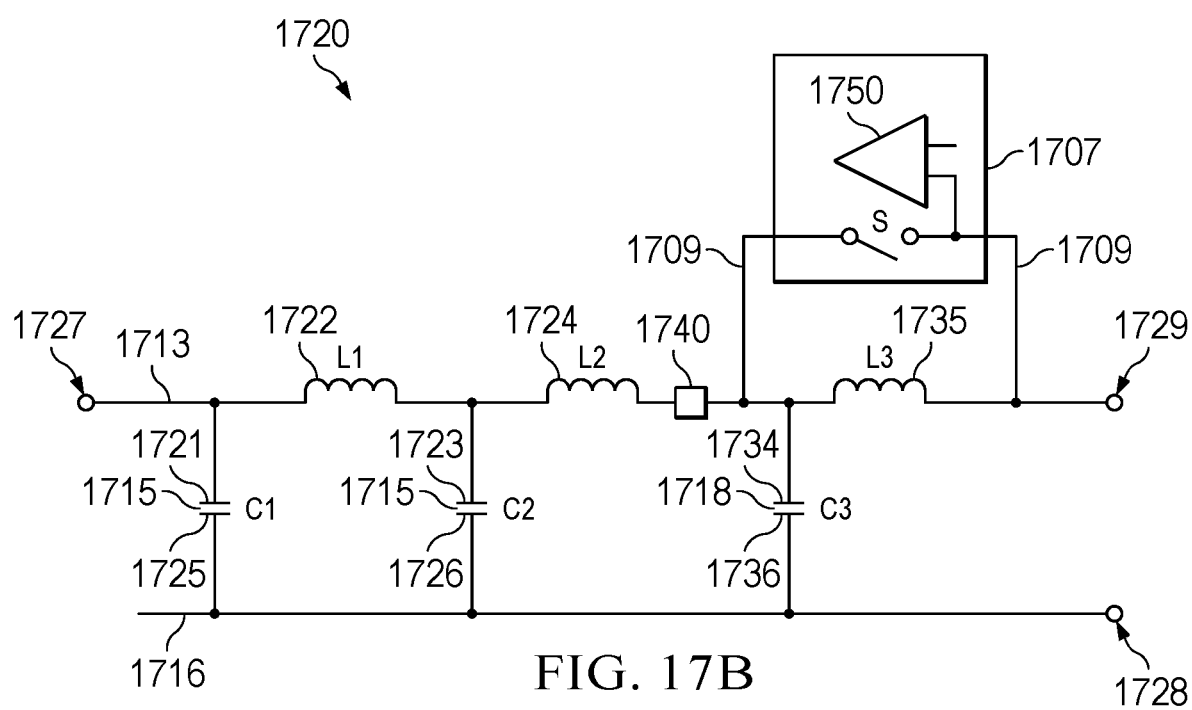
FIG. 17B is a schematic diagram of a multilevel package substrate filter circuit connected to an amplifier of a semiconductor die in the electronic device of FIG. 17.

FIGS. 17-17B show an integrated filter portion of another example electronic device 1700 having a third order C-L low pass filter 1720 integrated into a three level package substrate 1710. FIG. 17 shows a partial top perspective view, FIG. 17A shows a partial sectional side elevation view, and FIG. 17B shows a schematic diagram of a multilevel package substrate filter circuit 1720 connected to an amplifier 1750 of a semiconductor die 1707 in the electronic device 1700. The electronic device 1700 in one implementation includes a package structure (not shown) that at least partially encloses the semiconductor die 1707. The semiconductor die 1707 has conductive features 1709 (FIG. 17B), such as aluminum or coper bond pads or pillars or solder balls that are mechanically attached to, and form electrical connections to, conductive metal features of the multilevel package substrate 1710.

As shown in FIGS. 17 and 17A, the multilevel package substrate 1710 has a first level 1711 with patterned conductive first metal trace features 1713 and a second level 1712 with patterned conductive second metal trace features 1716. The semiconductor die 1707 includes one or more electronic components and the circuitry of the semiconductor die 1707 is electrically coupled to conductive metal features of the multilevel package substrate 1710 to form an integrated circuit electronic device 1700. The first level 1711 includes patterned conductive metal trace features 1713 and conductive metal via features 1714 (FIG. 17A), as well as a first dielectric layer 1715 over and between the conductive metal trace features 1713 and between the conductive metal via features 1714 of the first level 1711. Portions of the first dielectric layer 1715 form the capacitor dielectric of the respective first and second capacitors C1 and C2. The second level 1712 includes patterned conductive metal trace features 1716 and conductive metal via features 1717 (FIG. 17A), as well as a second dielectric layer 1718 over and between the conductive metal trace features 1716 and between the conductive metal via features 1714 of the second level.

The electronic device 1700 in this example includes a three level package substrate 1710 with a third level 1733. The third order filter circuit 1720 includes inductors L1-L3 and capacitors C1-C3 formed in the levels 1711, 1712, and 1733. The first and second levels 1711 and 1712 both include trace features and via features, and the third level 1733 in this example includes conductive metal trace features 1719 (FIG. 17A), and the third level 1733 does not include via features.

The filter circuit 1720 is a third-order low pass filter with a first capacitor C1 connected between a filter input terminal 1727 and a ground or reference terminal 1728, a first inductor L1 connected between upper or first capacitor plates of the first capacitor C1 and a second capacitor C2, as well as a second inductor L2 coupled between the node joining the first inductor L1 and the second capacitor C2. A third capacitor C3 is coupled between the second terminal of the second inductor L2 and the reference terminal 1728, and the third inductor L3 is coupled between the upper capacitor plate of the third capacitor C3 and a filter output terminal 1729. In this example, the first dielectric layer 1715 (FIGS. 1A and 1B) extends between first and second (e.g., upper and lower) capacitor plates of the capacitors C1 and C2 to provide the associated capacitor dielectrics. In other examples, a single or multiple filter circuits can include different filter types (e.g., band pass filters, high pass filters, etc.). In this example, the filter input terminal 1727 is electrically coupled through conductive metal structures of the multilevel package substrate 1710 to a lead (not shown) of the electronic device 1700.

The first level 1711 in this example includes a patterned first conductive metal trace 1713 that forms a set of contiguous metal structures that sequentially define (e.g., left to right in the view of FIG. 17A) the filter input terminal 1727, a first capacitor plate 1721 of the first capacitor C1, a serpentine first inductor winding 1722 of the first inductor L1, and a first capacitor plate 1723 of the second capacitor C2. A feed-through structure 1740 provides a conductive metal connection through a first via 1714, a portion of the second trace structure 1716, and a second via 1717 to the third conductive metal trace 1719, which connects the first (e.g., upper) plate 1723 of the second capacitor C2 to a serpentine second inductor winding 1724 (FIG. 17A) of the second inductor L2. The first conductive metal trace 1713 extends in a first X-Y plane in the illustrated orientation.

The second level 1712 in this example includes a second conductive metal trace 1716 that sequentially define (e.g., right to left in the view of FIG. 17A) forms a set of contiguous metal structures including a second (e.g., lower or bottom) capacitor plate 1725 of the first capacitor C1, a second capacitor plate 1726 of the second and third capacitors C2, C3, and the reference terminal 1728. The second conductive metal trace 1716 extends in a second X-Y plane that is parallel to and spaced apart from the first plane of the first conductive metal trace 1713.

The third level 1733 extends in a third X-Y plane that is parallel to and spaced apart from the first and second X-Y planes. The third level 1733 in this example has a third conductive metal trace 1719 that forms a set of contiguous metal structures that sequentially define (e.g., right to left in FIG. 17A) a serpentine second inductor winding 1724 of the second inductor L2, a first capacitor plate 1734 (e.g., the bottom plate in this example) of the third capacitor C3, a serpentine third inductor winding 1735 of the third inductor L3, and the filter output terminal 1729.

In one implementation, the semiconductor die 1707 (FIG. 17B) includes configurable or programmable switches to selectively couple an input of a high speed amplifier 1750 to a selected one of the terminals of one of the inductors, such as the third inductor L3, to adjust a performance characteristic (e.g., low pass filter cutoff frequency) of the filter circuit 1720. In the example of FIG. 17B, the input of the amplifier 1750 is coupled to the second terminal of the third inductor L3, and the semiconductor die 1707 has a switch S coupled between the first and second conductive structures 1709 to selectively bypass the third inductor L3. In other implementations, a programmable or configurable circuit (not shown) of the semiconductor die 1707 can bypass a different one of the inductors L1-L3.

Figures 18A, 18B:
FIGS. 18A and 18B are partial top plan views and insertion and return loss simulated performance graphs for a stepped impedance low pass filter circuit with a cutoff frequency of 20 GHz.

FIGS. 18A-18F illustrate comparative size and performance benefits for example integrated low pass filters with a cutoff frequency of approximately 20 GHz. FIG. 18A shows an example stepped impedance low pass filter circuit formed in a multilevel package substrate, which has a conductive feature width of 0.4 mm, a length of 6.27 mm, a spacing between first and second impedance structures of 1.0 mm, and a spacing between second and third impedance structures of 1.4 mm, with a total area of 2.51 mm$^2$. FIG. 18B shows low pass filter response graphs including a corresponding insertion loss graph 1801 in dB as a function of frequency, as well as a return loss graph 1802 in dB as a function of frequency.

Figure 18D:
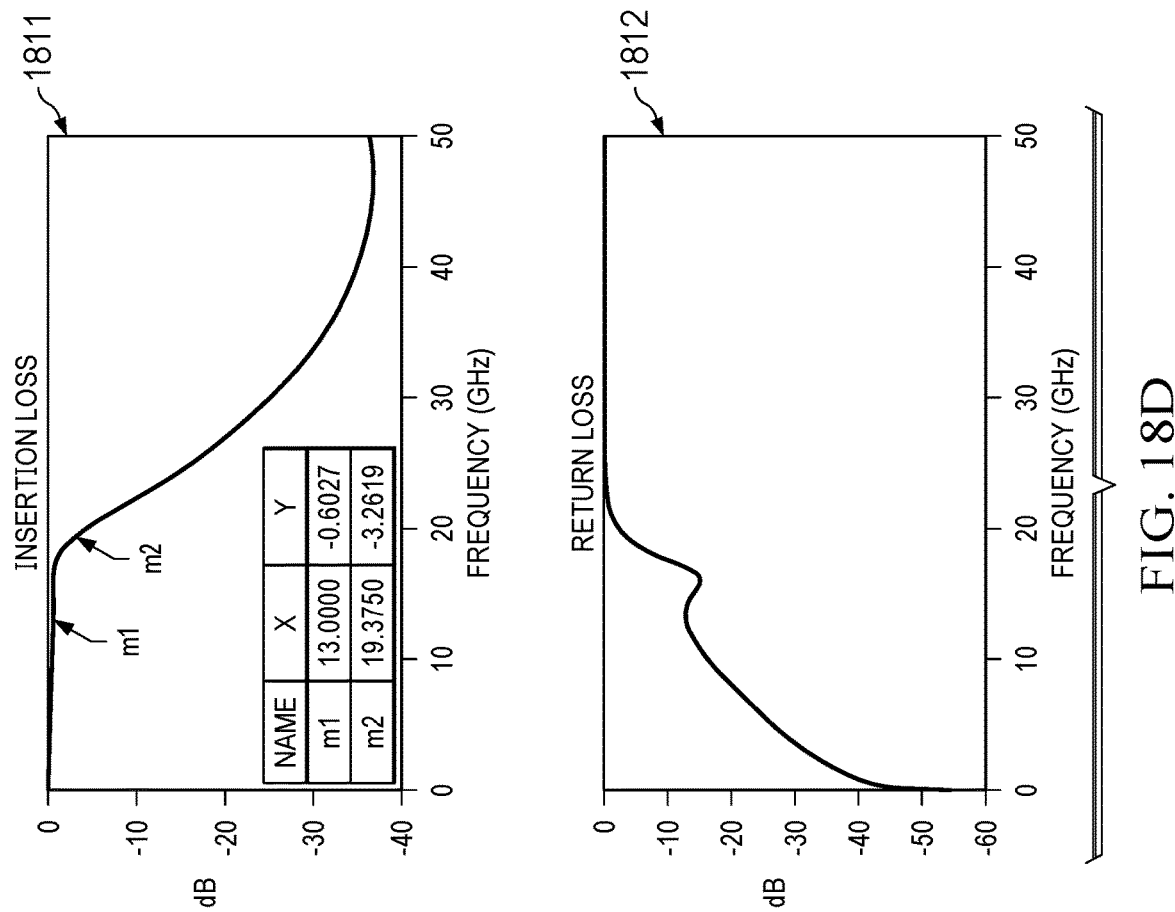
FIGS. 18C and 18D are partial top plan views and insertion and return loss simulated performance graphs for a two level multilevel package substrate with an integrated third order C-L low pass filter circuit with a cutoff frequency of 20 GHz.
Figure 18C:
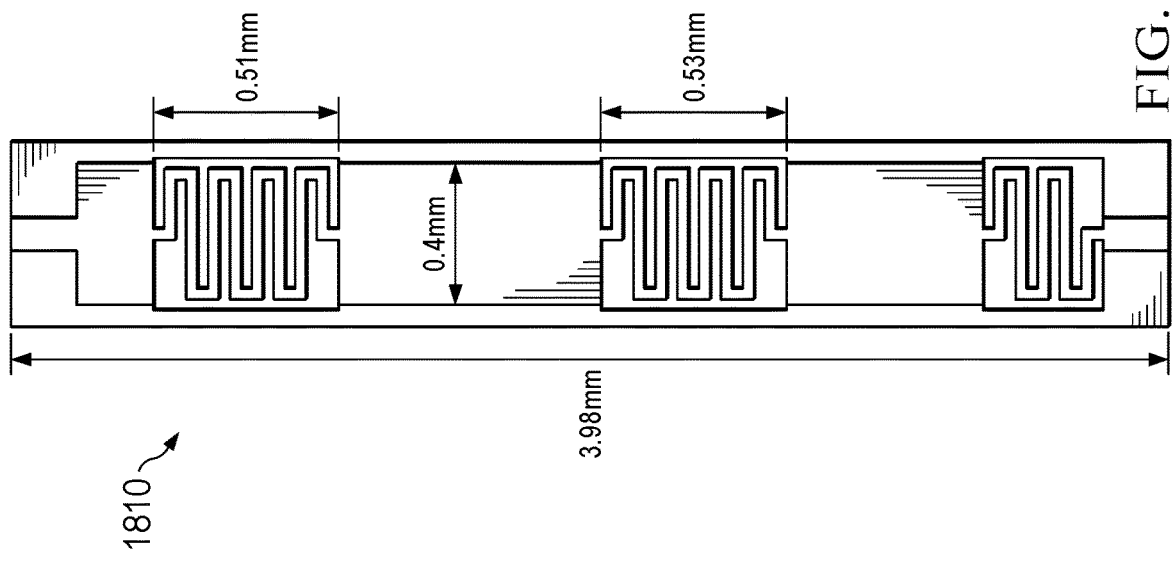

FIG. 18C shows an example third order C-L integrated low pass filter 1810, similar to the integrated low pass filter circuit 1620 of FIG. 16 described above, which has a conductive feature width of 0.4 mm, a significantly shorter overall length of 3.98 mm, a spacing of 0.51 mm between the first and second capacitors, and a spacing of 0.53 mm between the second and third capacitors, with a smaller overall area of 1.5 mm$^2$. FIG. 18D shows low pass filter response graphs including a corresponding insertion loss graph 1811 in dB as a function of frequency, as well as a return loss graph 1812 in dB as a function of frequency. The insertion and return loss performance of the filter 1810 in FIGS. 18C and 18D is superior to that of the stepped impedance filter 1800 of FIGS. 18A and 18B, including significantly improved insertion loss performance beyond 40 GHz. Thus, the integrated low pass filter 1810 provides performance as well as area and space improvements.

FIG. 18E shows another example third order C-L integrated low pass filter 1820 integrated into a three-level multilevel package substrate structure, similar to the integrated low pass filter circuit 1720 of FIG. 17 described above. The integrated filter 1820 in this example has a conductive feature width of 0.4 mm and a further reduced overall length of 2.3 mm, including advantages achieved by wrapping the filter structure using a feedthrough (e.g., 1740 in FIG. 17 above) in a three-level package substrate, with an overall area of 0.92 mm$^2$. FIG. 18F shows low pass filter response graphs including a corresponding insertion loss graph 1821 in dB as a function of frequency, as well as a return loss graph 1822 in dB as a function of frequency, including a parasitic notch 1830 created by the feedthrough structure (e.g., 1740 in FIG. 17). The insertion and return loss performance of the filter 1820 in FIGS. 18E and 18F is superior to that of the stepped impedance filter 1800 of FIGS. 18A and 18B and comparable to that of the integrated C-L filter 1810, in addition to the added area and length reductions.

Figure 19B:
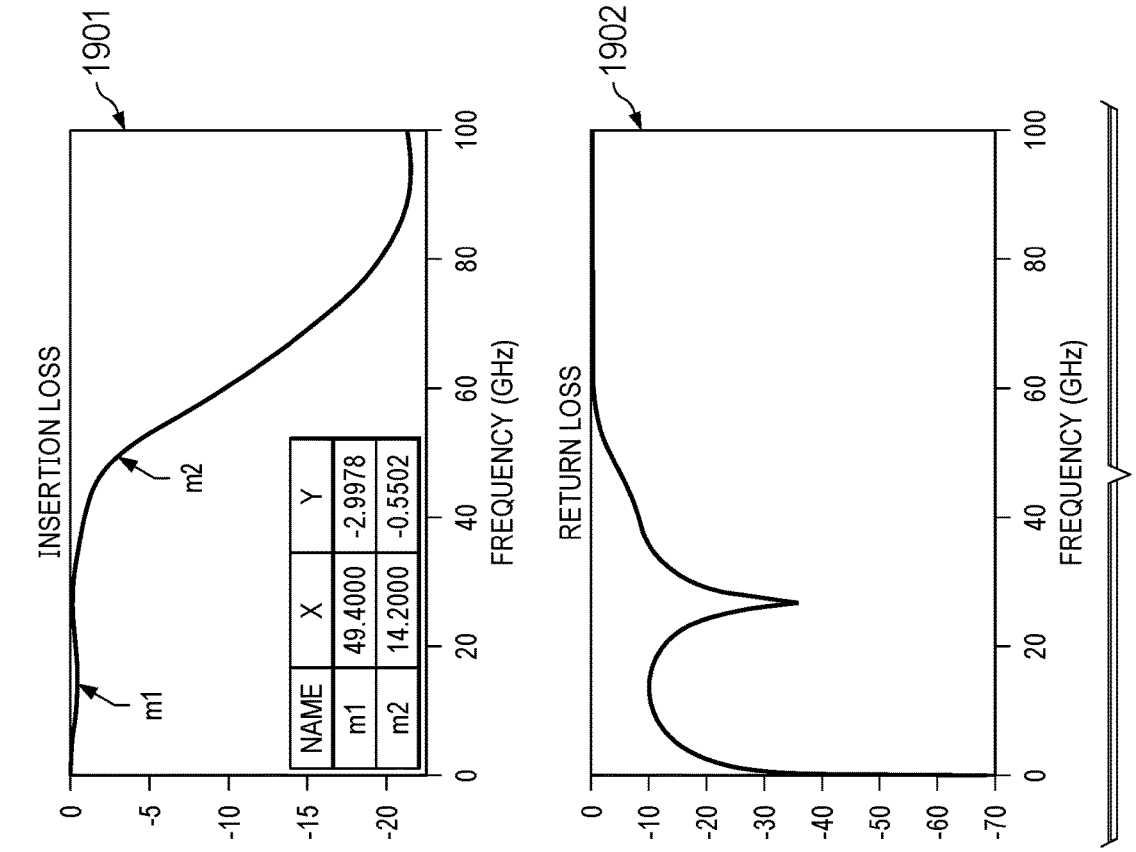
FIGS. 19A and 19B are partial top plan views and insertion and return loss simulated performance graphs for a stepped impedance low pass filter circuit with a cutoff frequency of 50 GHz.
Figure 19A:
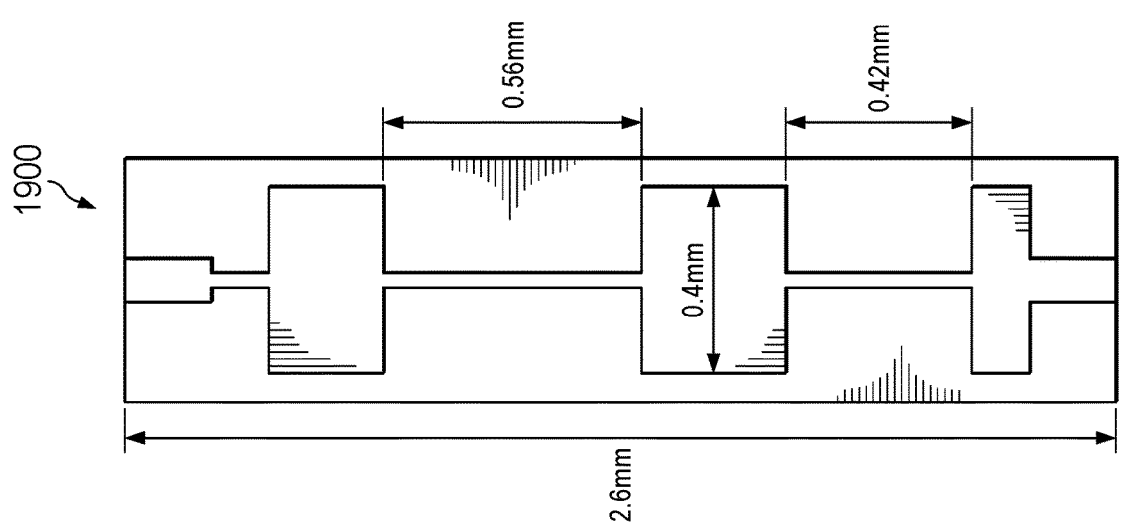

FIGS. 19A and 19B show further examples of comparative size and performance benefits for example integrated low pass filters with a cutoff frequency of approximately 50 GHz. FIG. 19A shows an example three stage stepped impedance low pass filter circuit formed in a multilevel package substrate, which has a conductive feature width of 0.4 mm, a length of 2.6 mm, a spacing between first and second impedance structures of 0.56 mm, and a spacing between second and third impedance structures of 0.42 mm, with a total area of 2.6 mm$^2$. FIG. 19B shows low pass filter response graphs including a corresponding insertion loss graph 1901 in dB as a function of frequency, as well as a return loss graph 1902 in dB as a function of frequency.

Figures 19C, 19D:
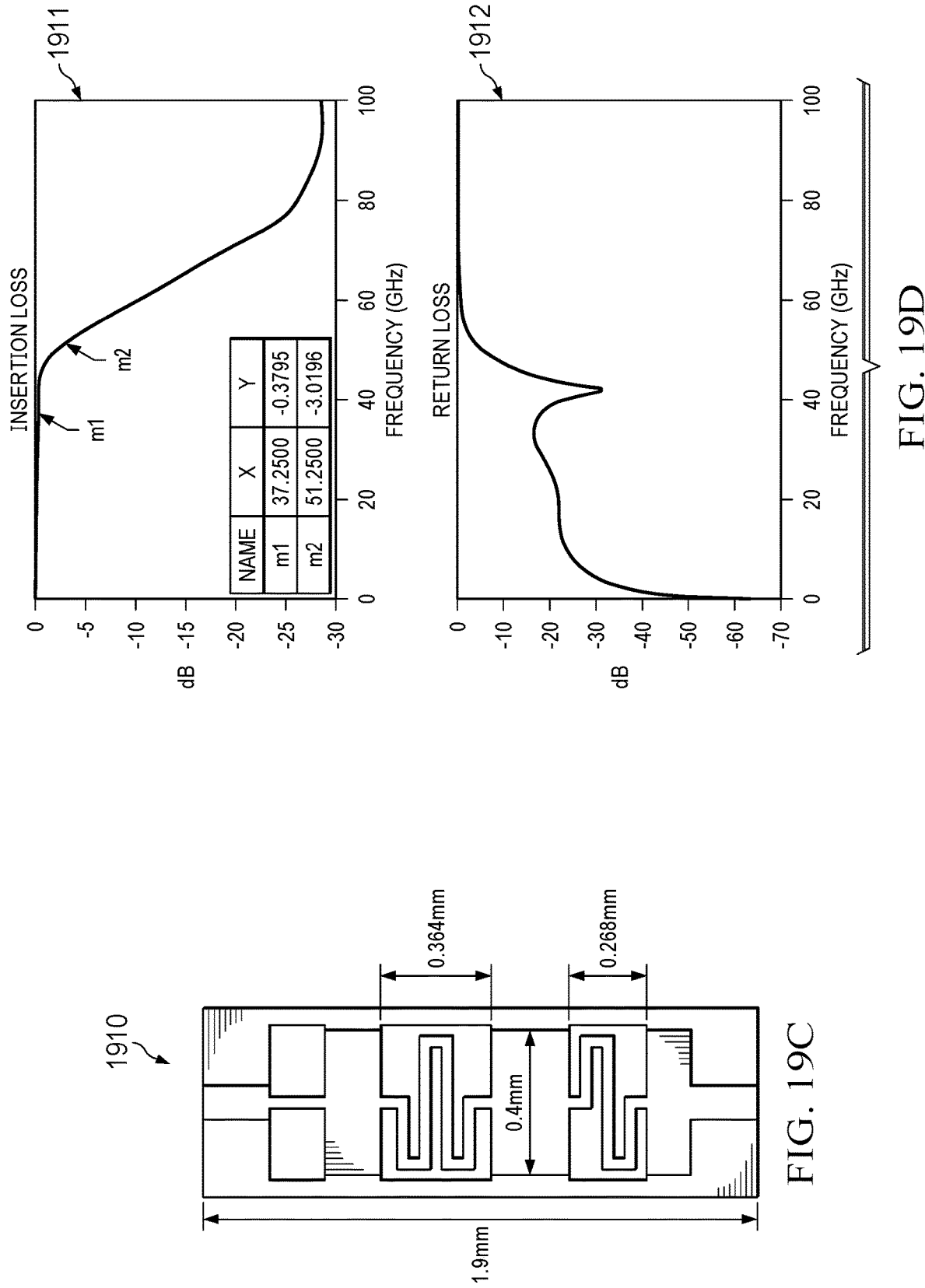
FIGS. 19C and 19D are partial top plan views and insertion and return loss simulated performance graphs for a two level multilevel package substrate with an integrated third order C-L low pass filter circuit with a cutoff frequency of 50 GHz.

FIG. 19C shows an example second order C-L integrated low pass filter 1910 with a conductive feature width of 0.4 mm, a significantly shorter overall length of 1.9 mm, a spacing of 0.364 mm between the first and second capacitors, and a spacing of 0.268 mm between the second and third capacitors, with a smaller overall area of 0.76 mm$^2$. FIG. 19D shows low pass filter response graphs including a corresponding insertion loss graph 1911 in dB as a function of frequency, as well as a return loss graph 1912 in dB as a function of frequency. The insertion and return loss performance of the filter 1910 in FIGS. 19C and 19D is superior to that of the stepped impedance filter 1900 of FIGS. 19A and 19B, and the integrated low pass filter 1910 provides performance as well as area and space improvements.

Figure 19F:
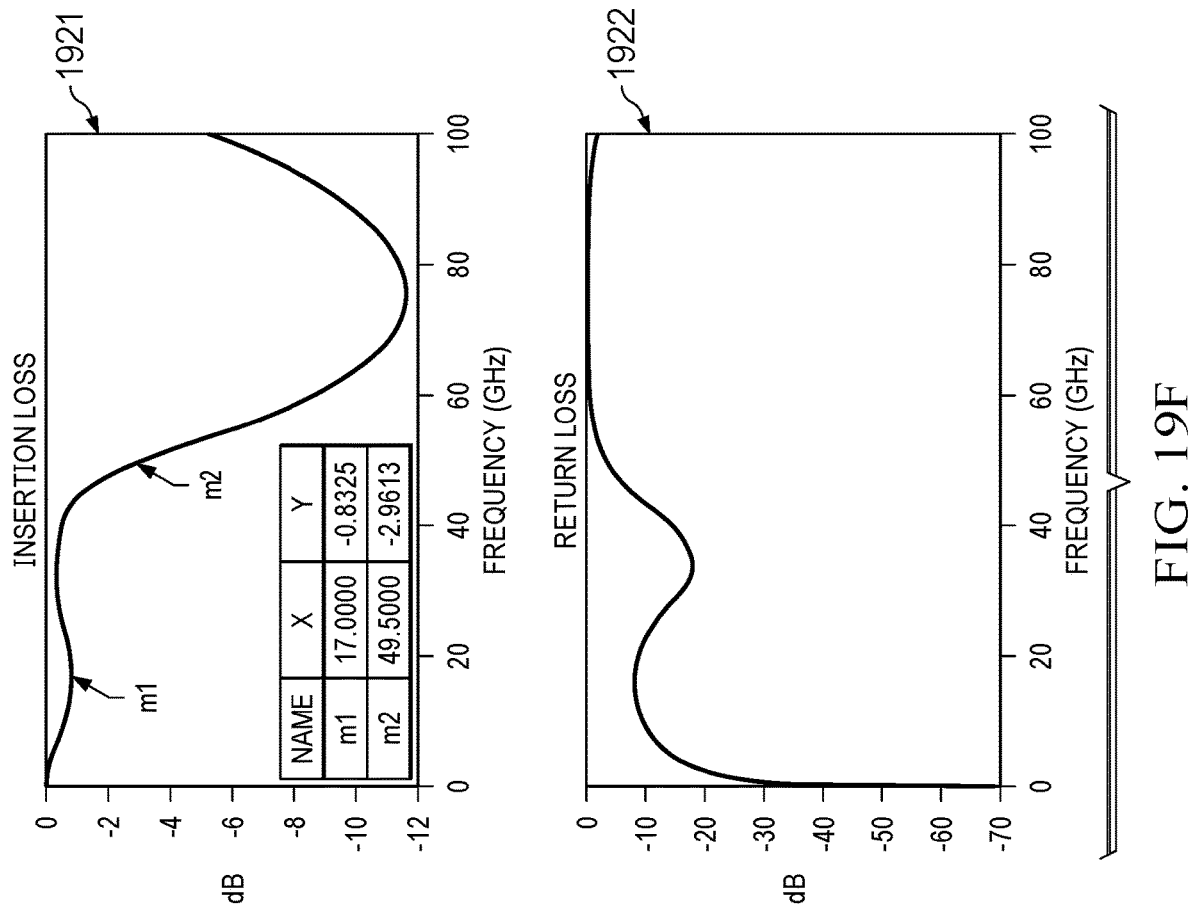
FIGS. 19E and 19F are partial top plan views and insertion and return loss simulated performance graphs for a three level multilevel package substrate with an integrated third order C-L low pass filter circuit with a cutoff frequency of 50 GHz.
Figure 19E:
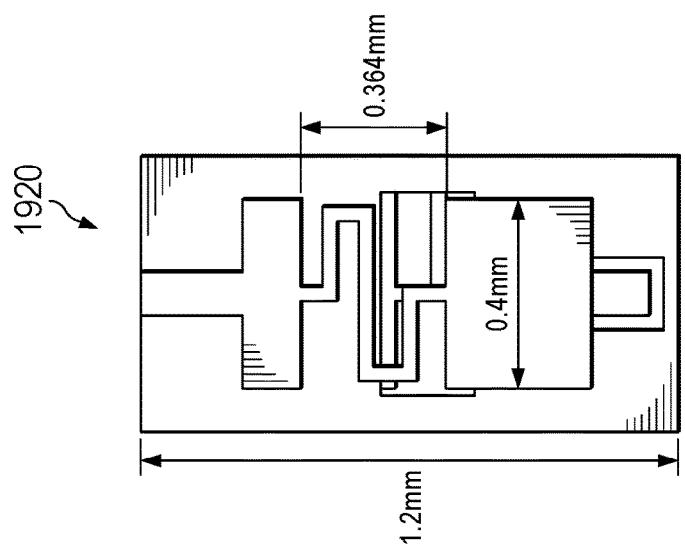

FIG. 19E shows another example third order integrated low pass filter 1920 integrated into a three-level multilevel package substrate structure, similar in some respects to the integrated low pass filter circuit 1720 of FIG. 17 described above and designed for a cutoff frequency of approximately 50 GHz. The integrated filter 1920 in this example has a conductive feature width of 0.4 mm, a spacing of 0.364 mm between the first and second capacitors, and a further reduced overall length of 1.2 mm, including advantages achieved by wrapping the filter structure using a feedthrough (e.g., 1740 in FIG. 17 above) in a three-level package substrate, with an overall area of 0.36 mm$^2$. FIG. 19F shows low pass filter response graphs including a corresponding insertion loss graph 1921 in dB as a function of frequency, as well as a return loss graph 1922 in dB as a function of frequency, which show insertion and return loss performance that is superior to that of the stepped impedance filter 1900 of FIGS. 19A and 19B and comparable to that of the integrated C-L filter 1910, in addition to the added area and length reductions.

The described examples provide filtering solutions that can be integrated within existing lead frame and multilevel package substrate designs rather than providing filter circuit components on-chip or as external off-chip passive components, thereby facilitating higher circuit density and smaller system area with cost benefits compared with other solutions.

Modifications are possible in the described examples, and other implementations are possible, within the scope of the claims.

What is claimed is:

1. An electronic device, comprising:
a multilevel package substrate having a first level, a second level, and a filter circuit in the first and second levels, the filter circuit including a filter input terminal, a first capacitor, a first inductor, a second capacitor, a second inductor, a filter output terminal, and a reference terminal;
a semiconductor die attached to the multilevel package substrate and having a conductive structure coupled to one of the terminals of the filter circuit; and
a package structure that encloses the semiconductor die and a portion of the multilevel package substrate.

2. The electronic device of claim 1, wherein:
the first level includes a first conductive metal trace that forms a set of contiguous metal structures including the filter input terminal, a first capacitor plate of the first capacitor, a serpentine first inductor winding of the first inductor, a first capacitor plate of the second capacitor, a serpentine second inductor winding of the second inductor, and the filter output terminal; and
the second level includes a second conductive metal trace that forms a set of contiguous metal structures including a second capacitor plate of the first capacitor, a second capacitor plate of the second capacitor, and the reference terminal.

3. The electronic device of claim 2, wherein:
the first conductive metal trace extends in a first plane of a first direction and an orthogonal second direction;
the second conductive metal trace extends in a second plane of the first and second directions; and
the first and second planes are spaced apart from one another along a third direction that is orthogonal to the first and second directions.

4. The electronic device of claim 3, wherein:
the multilevel package substrate includes a dielectric layer that extends between the first and second capacitor plates of the first capacitor along the third direction; and
the dielectric layer extends between the first and second capacitor plates of the second capacitor along the third direction.

5. The electronic device of claim 4, wherein the second conductive metal trace includes a first opening under the serpentine first inductor winding of the first inductor, and a second opening under the serpentine second inductor winding of the second inductor.

6. The electronic device of claim 1, wherein the filter circuit includes a third capacitor and a third inductor.

7. The electronic device of claim 6, wherein:
the multilevel package substrate has a third level;
the first level includes a first conductive metal trace that forms a set of contiguous metal structures including the filter input terminal, a first capacitor plate of the first capacitor, a serpentine first inductor winding of the first inductor, and a first capacitor plate of the second capacitor;
the second level includes a second conductive metal trace that forms a set of contiguous metal structures including a second capacitor plate of the first capacitor, a second capacitor plate of the second and third capacitors, and the reference terminal; and
the third level has a third conductive metal trace that forms a set of contiguous metal structures including a serpentine second inductor winding of the second inductor, a first capacitor plate of the third capacitor, a serpentine third inductor winding of the third inductor, and the filter output terminal.

8. The electronic device of claim 6, wherein:
the first level includes a first conductive metal trace that forms a set of contiguous metal structures including the filter input terminal, a first capacitor plate of the first capacitor, a serpentine first inductor winding of the first inductor, a first capacitor plate of the second capacitor, a serpentine second inductor winding of the second inductor, a first capacitor plate of the third capacitor, a serpentine third inductor winding of the third inductor, and the filter output terminal; and
the second level includes a second conductive metal trace that forms a set of contiguous metal structures including a second capacitor plate of the first capacitor, a second capacitor plate of the second and third capacitors, and the reference terminal.

9. The electronic device of claim 6, wherein the semiconductor die has a first conductive structure coupled to a first terminal of one of the first, second, and third inductors, and a second conductive structure coupled to a second terminal of the one of the first, second, and third inductors.

10. The electronic device of claim 9, wherein the semiconductor die has a switch coupled between the first and second conductive structures to selectively bypass the one of the first, second, and third inductors.

11. The electronic device of claim 1, wherein the semiconductor die has a first conductive structure coupled to a first terminal of one of the first and second inductors, and a second conductive structure coupled to a second terminal of the one of the first and second inductors.

12. The electronic device of claim 11, wherein the semiconductor die has a switch coupled between the first and second conductive structures to selectively bypass the one of the first and second inductors.

13. The electronic device of claim 1, wherein:
the multilevel package substrate includes a dielectric layer that extends between the first and second capacitor plates of the first capacitor; and
the dielectric layer extends between the first and second capacitor plates of the second capacitor.

14. The electronic device of claim 1, wherein the second conductive metal trace includes a first opening under the serpentine first inductor winding of the first inductor, and a second opening under the serpentine second inductor winding of the second inductor.

* * * * *